(12) United States Patent
Totoki et al.

(10) Patent No.: US 11,488,975 B2
(45) Date of Patent: Nov. 1, 2022

(54) MULTI-TIER THREE-DIMENSIONAL MEMORY DEVICE WITH NESTED CONTACT VIA STRUCTURES AND METHODS FOR FORMING THE SAME

(71) Applicant: SANDISK TECHNOLOGIES LLC, Addison, TX (US)

(72) Inventors: Yuji Totoki, Yokkaichi (JP); Fumitaka Amano, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 73 days.

(21) Appl. No.: 17/081,458

(22) Filed: Oct. 27, 2020

(65) Prior Publication Data
US 2022/0130852 A1 Apr. 28, 2022

(51) Int. Cl.
*H01L 27/115* (2017.01)
*H01L 23/522* (2006.01)
(Continued)

(52) U.S. Cl.
CPC .... *H01L 27/11582* (2013.01); *H01L 23/5226* (2013.01); *H01L 27/1157* (2013.01);
(Continued)

(58) Field of Classification Search
CPC ........... H01L 29/7808; H01L 27/11273; H01L 29/7802; H01L 29/66712; H01L 27/11517;
(Continued)

(56) References Cited

U.S. PATENT DOCUMENTS 5,915,167 A 6/1999 Leedy
7,696,559 B2 * 4/2010 Arai .................. H01L 29/66833
257/315
(Continued)

OTHER PUBLICATIONS

Endoh, T. et al., "Novel Ultra High Density Memory with a Stacked-Surrounding Gate Transistor (S-SGT) Structured Cell," IEDM Proc., (2001), 33-36.
(Continued)

*Primary Examiner* — Mary A Wilczewski
*Assistant Examiner* — Tsz K Chiu
(74) *Attorney, Agent, or Firm* — The Marbury Law Group PLLC

(57) ABSTRACT

A semiconductor structure includes a first alternating stack of first insulating layers and first electrically conductive layers having first stepped surfaces and located over a substrate, a second alternating stack of second insulating layers and second electrically conductive layers having second stepped surfaces, and memory opening fill structures extending through the alternating stacks. A contact via assembly is provided, which includes a first conductive via structure vertically extending from a top surface of one of the first electrically conductive layers through a subset of layers within the second alternating stack and through the second retro-stepped dielectric material portion, an insulating spacer located within an opening through the subset of layers, and a second conductive via structure laterally surrounding the insulating spacer and contacting a second electrically conductive layer.

14 Claims, 29 Drawing Sheets

(51) Int. Cl.
*H01L 27/11582* (2017.01)
*H01L 27/1157* (2017.01)
H01L 21/768 (2006.01)
H01L 27/11565 (2017.01)
H01L 21/3205 (2006.01)
H01L 27/11573 (2017.01)
H01L 27/11531 (2017.01)

(52) U.S. Cl.
CPC .. *H01L 21/32055* (2013.01); *H01L 21/76802* (2013.01); *H01L 21/76877* (2013.01); *H01L 27/11531* (2013.01); *H01L 27/11565* (2013.01); *H01L 27/11573* (2013.01)

(58) Field of Classification Search
CPC ............. H01L 29/788; H01L 29/42324; H01L 29/66825; H01L 29/792; H01L 2924/13081; H01L 2924/13085; H01L 29/6684; H01L 29/78391; H01L 29/4236; H01L 27/11524; H01L 27/1157; H01L 27/11578; H01L 27/11582
See application file for complete search history.

(56) References Cited

U.S. PATENT DOCUMENTS

| | | | | |
|---|---|---|---|---|
| 7,982,260 B2* | 7/2011 | Fukuzumi | ............. | H01L 29/792 257/329 |
| 8,030,700 B2* | 10/2011 | Sakamoto | ......... | H01L 27/11578 257/306 |
| 8,072,024 B2* | 12/2011 | Ishikawa | ........... | H01L 27/11582 438/386 |
| 8,211,811 B2* | 7/2012 | Matsushita | ....... | H01L 29/66833 438/763 |
| 8,236,673 B2* | 8/2012 | Son | .................... | H01L 29/7926 438/259 |
| 8,338,876 B2* | 12/2012 | Kito | ................... | H01L 29/7926 257/314 |
| 8,349,681 B2* | 1/2013 | Alsmeier | .......... | H01L 29/66825 257/E21.309 |
| 8,415,242 B2* | 4/2013 | Mizushima | ......... | H01L 29/7926 257/E21.409 |
| 8,552,489 B2* | 10/2013 | Eom | ................... | H01L 29/4234 257/E21.21 |
| 8,658,499 B2* | 2/2014 | Makala | ............. | H01L 29/40117 257/334 |
| 8,829,595 B2* | 9/2014 | Lee | ................... | H01L 27/11582 257/E21.21 |
| 8,928,061 B2* | 1/2015 | Chien | ............... | H01L 21/32053 257/315 |
| 8,994,091 B2* | 3/2015 | Lee | ................... | H01L 29/7926 257/316 |
| 9,018,682 B2* | 4/2015 | Izumida | ............ | H01L 27/11582 257/234 |
| 9,076,879 B2* | 7/2015 | Yoo | .................... | H01L 29/7926 |
| 9,099,496 B2* | 8/2015 | Tian | ................... | H01L 29/7889 |
| 9,159,739 B2* | 10/2015 | Makala | ............. | H01L 27/11556 |
| 9,236,396 B1* | 1/2016 | Koka | ................... | H01L 29/517 |
| 9,305,849 B1 | 4/2016 | Tsutsumi | ............ | H01L 27/1157 |
| 9,312,008 B2* | 4/2016 | Nam | ................... | G11C 16/3459 |
| 9,406,694 B1* | 8/2016 | Ikeno | ............... | H01L 29/66833 |
| 9,589,981 B2* | 3/2017 | Nishikawa | ......... | H01L 21/76877 |
| 9,634,024 B2* | 4/2017 | Kanamori | ........... | H01L 27/1157 |
| 9,659,958 B2* | 5/2017 | Lee | ................... | H01L 27/11582 |
| 9,960,181 B1 | 5/2018 | Cui et al. | | |
| 10,068,917 B2* | 9/2018 | Kanamori | ......... | H01L 27/11582 |
| 10,269,620 B2 | 4/2019 | Yu et al. | | |
| 10,276,583 B2* | 4/2019 | Sharangpani | ....... | H01L 27/0688 |
| 10,304,852 B1 | 5/2019 | Cui et al. | | |
| 10,340,286 B2* | 7/2019 | Goda | ................. | H01L 27/11582 |
| 10,566,346 B2* | 2/2020 | Lee | .................... | H01L 27/11568 |
| 10,629,675 B1* | 4/2020 | Nishikawa | .......... | H01L 29/7883 |
| 10,727,248 B2 | 7/2020 | Kaminaga | | |
| 2008/0173928 A1* | 7/2008 | Arai | .................... | H01L 29/7926 257/E21.409 |
| 2010/0019310 A1* | 1/2010 | Sakamoto | ............. | H01L 29/792 257/324 |
| 2010/0038699 A1* | 2/2010 | Katsumata | ........ | H01L 29/66833 257/E21.409 |
| 2012/0012920 A1* | 1/2012 | Shin | ..................... | H01L 29/4234 257/E29.262 |
| 2012/0091521 A1* | 4/2012 | Goda | ................. | H01L 29/66666 257/E29.17 |
| 2012/0098050 A1* | 4/2012 | Shim | ................. | H01L 27/11578 257/E29.262 |
| 2012/0140562 A1* | 6/2012 | Choe | .................... | H01L 27/1157 257/329 |
| 2012/0267702 A1* | 10/2012 | Jee | ...................... | H01L 27/11582 257/E21.423 |
| 2013/0134493 A1* | 5/2013 | Eom | .................. | H01L 27/11582 257/314 |
| 2013/0270643 A1* | 10/2013 | Lee | ..................... | H01L 27/1052 257/365 |
| 2014/0203442 A1* | 7/2014 | Yun | .................... | H01L 27/11548 257/773 |
| 2015/0236038 A1* | 8/2015 | Pachamuthu | ....... | H01L 21/8221 257/326 |
| 2015/0318296 A1* | 11/2015 | Kim | .................. | H01L 27/11519 257/296 |
| 2016/0104715 A1* | 4/2016 | Pachamuthu | ..... | H01L 27/11575 257/326 |
| 2016/0293625 A1* | 10/2016 | Kang | ................. | H01L 27/11565 |
| 2016/0365351 A1* | 12/2016 | Nishikawa | ......... | H01L 27/11568 |
| 2017/0040337 A1* | 2/2017 | Kim | .................. | H01L 27/11573 |
| 2017/0221921 A1* | 8/2017 | Kanamori | ......... | H01L 29/42344 |
| 2017/0236746 A1* | 8/2017 | Yu | ...................... | H01L 21/76805 257/314 |
| 2017/0309635 A1* | 10/2017 | Kim | .................. | H01L 27/0688 |
| 2019/0252396 A1 | 8/2019 | Mushiga et al. | | |
| 2019/0252403 A1 | 8/2019 | Kaminaga et al. | | |
| 2019/0252404 A1 | 8/2019 | Kaminaga | | |
| 2020/0035694 A1 | 1/2020 | Kaminaga | | |
| 2020/0119031 A1* | 4/2020 | Shen | ................. | H01L 27/11575 |
| 2021/0358937 A1* | 11/2021 | Yamaguchi | ....... | H01L 27/11565 |

OTHER PUBLICATIONS

U.S. Appl. No. 16/366,245, filed Mar. 27, 2019, SanDisk Technologies LLC.
U.S. Appl. No. 16/366,330, filed Mar. 27, 2019, SanDisk Technologies LLC.
U.S. Appl. No. 16/881,353, filed May 22, 2020, SanDisk Technologies LLC.
U.S. Appl. No. 16/918,463, filed Jul. 1, 2020, SanDisk Technologies LLC.
U.S. Appl. No. 16/918,493, filed Jul. 1, 2020, SanDisk Technologies LLC.
U.S. Appl. No. 16/999,388, filed Aug. 21, 2020, SanDisk Technologies LLC.

* cited by examiner

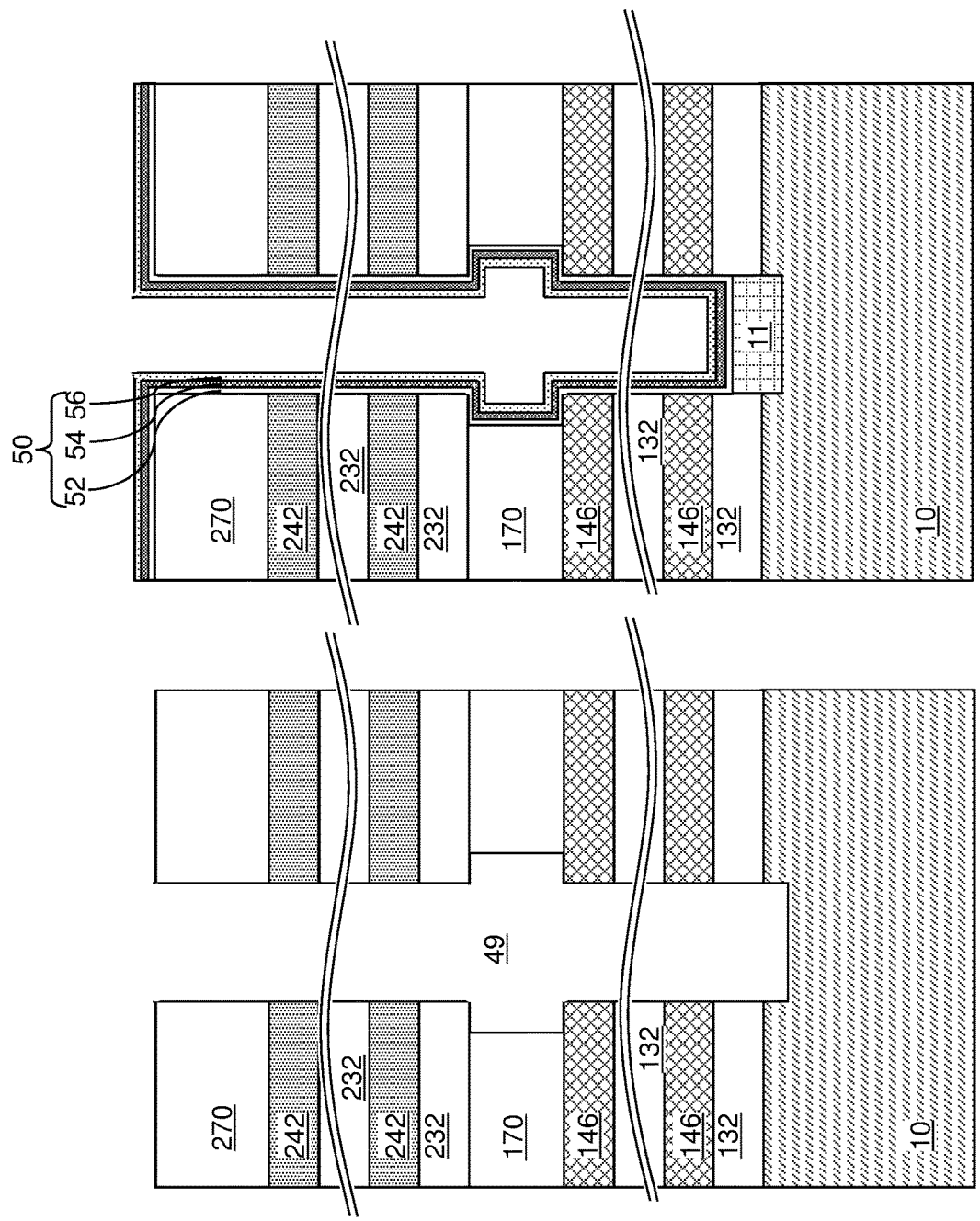

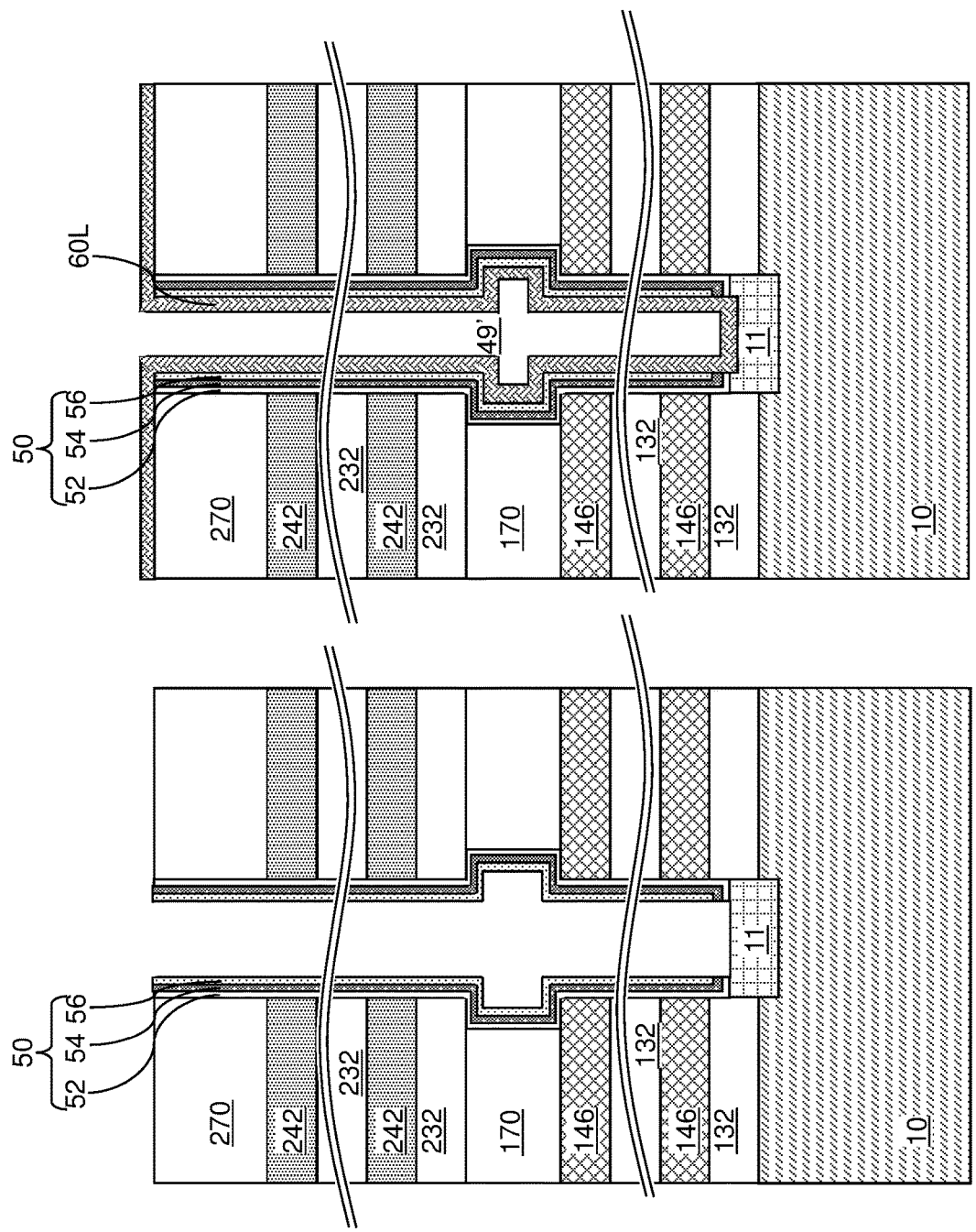

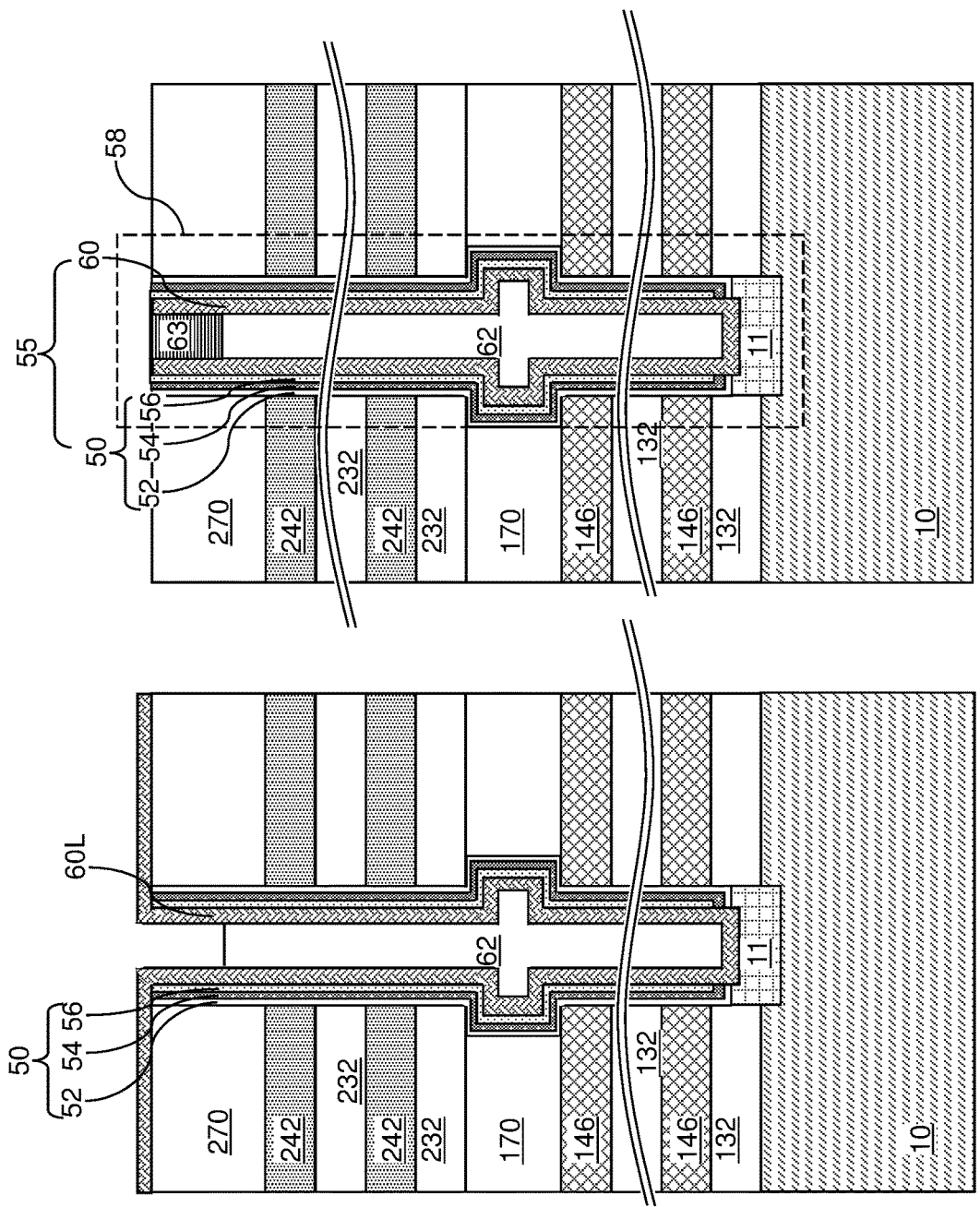

a# MULTI-TIER THREE-DIMENSIONAL MEMORY DEVICE WITH NESTED CONTACT VIA STRUCTURES AND METHODS FOR FORMING THE SAME

FIELD

The present disclosure relates generally to the field of semiconductor devices, and particularly to a multi-tier three-dimensional memory device including nested contact via structures and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure is provided, which comprises: a first alternating stack of first insulating layers and first electrically conductive layers having first stepped surfaces and located over a substrate; a first retro-stepped dielectric material portion overlying the first stepped surfaces; a second alternating stack of second insulating layers and second electrically conductive layers having second stepped surfaces; a second retro-stepped dielectric material portion overlying the second stepped surfaces; memory openings vertically extending through the first alternating stack and the second alternating stack; memory opening fill structures located in the memory openings and comprising a respective vertical semiconductor channel and a respective memory film; and a contact via assembly comprising a first conductive via structure vertically extending from a top surface of one of the first electrically conductive layers through a subset of layers within the second alternating stack and through the second retro-stepped dielectric material portion, an insulating spacer located within an opening through the subset of layers within the second alternating stack, and a second conductive via structure laterally surrounding the insulating spacer and contacting a top surface of a topmost second electrically conductive layer of the subset of layers within the second alternating stack.

According to another aspect of the present disclosure, a method of method of forming a semiconductor structure is provided, which comprises: forming a first-tier structure over a substrate, the first-tier structure including a first alternating stack of first insulating layers and first electrically conductive layers and a first retro-stepped dielectric material portion overlying first stepped surfaces of the first alternating stack; forming a second-tier structure comprising a second alternating stack of second insulating layers and sacrificial material layers and a second retro-stepped dielectric material portion overlying second stepped surfaces of the second alternating stack; forming a memory stack structure through the second-tier structure and the first-tier structure, wherein the memory stack structure comprises a vertical semiconductor channel and a memory film; forming a stepped contact via cavity through the second-tier structure, wherein the stepped contact via cavity comprises an upper portion overlying a subset of layers within the second alternating stack and a lower portion extending through the subset of layers; forming backside recesses by removing the sacrificial material layers selective to the second insulating layers; forming a continuous metallic material layer by depositing a metallic material in the backside recesses and at a periphery of the stepped contact via cavity; and patterning the continuous metallic material layer, wherein remaining patterned portions of the continuous metallic material layer comprise second electrically conductive layers located in the backside recesses and a tubular contact via structure adjoined to one of the second electrically conductive layers.

BRIEF DESCRIPTION OF THE DRAWINGS

FIGS. 10A-10F are sequential schematic vertical cross-sectional views of an inter-tier memory opening within the exemplary structure during formation of a memory opening fill structure therein according to an embodiment of the present disclosure.

DETAILED DESCRIPTION

Figure 1:
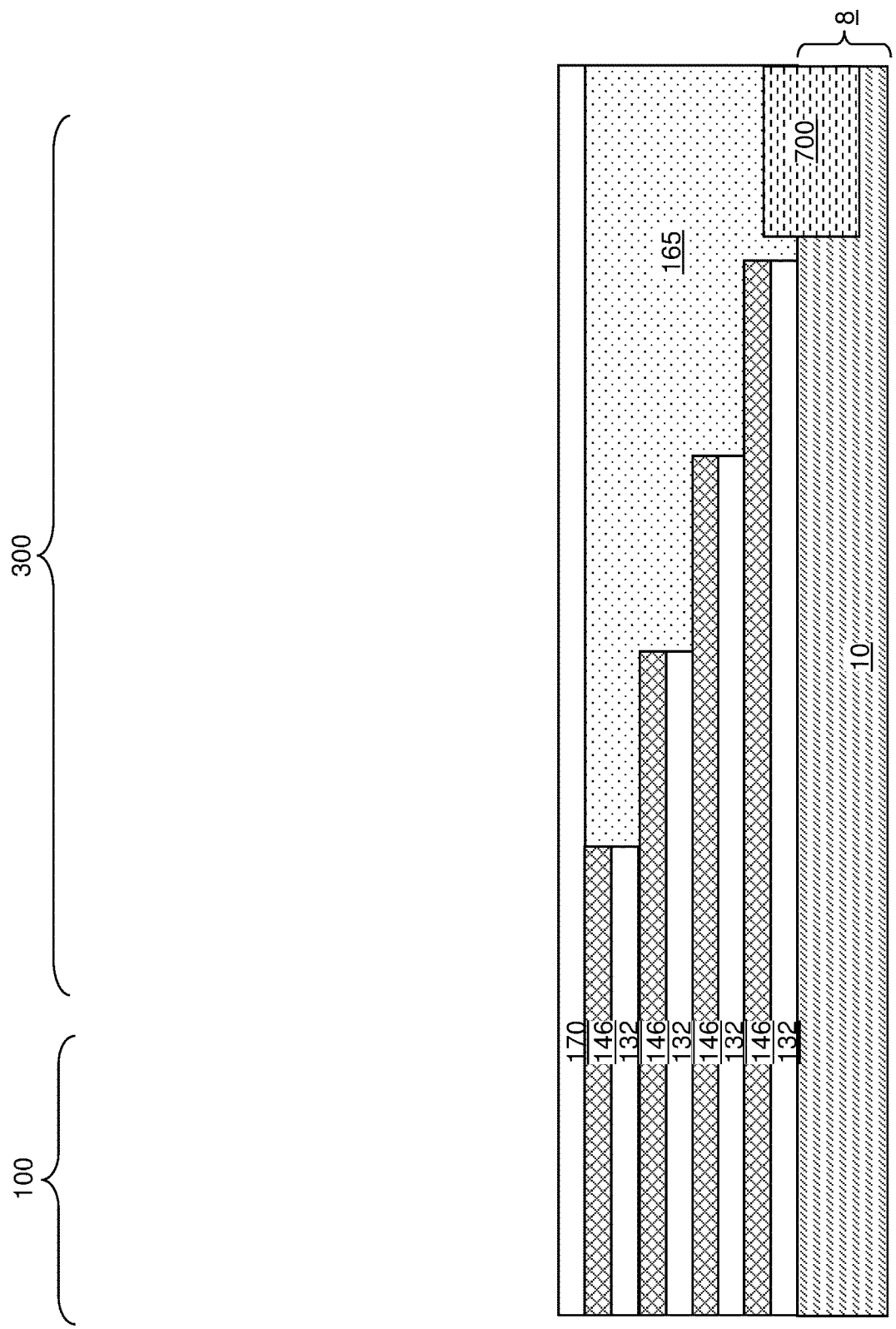
FIG. 1 is a schematic vertical cross-sectional view of an exemplary structure after formation of a first alternating stack of first insulating layers and first electrically conductive layers and a first retro-stepped dielectric material portion according to an embodiment of the present disclosure.

As discussed above, the present disclosure is directed to a multi-tier three-dimensional memory device including nested contact via structures and methods for manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which includes a substrate 8 including a substrate semiconductor layer 10. The substrate semiconductor layer 10 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one peripheral semiconductor device 700 for a peripheral circuitry can be formed on a portion of the substrate semiconductor layer 10. The at least one peripheral semiconductor device 700 can include, for example, field effect transistors.

In one alternative embodiment, the at least one semiconductor device 700 for a peripheral circuitry may be located under the memory array region in a CMOS under array configuration. In another alternative embodiment, the peripheral semiconductor device 700 may be located on a separate substrate which is subsequently bonded to the memory array region 100.

A first alternating stack of first insulating layers 132 and first electrically conductive layers 146 can be formed over the substrate semiconductor layer 10. The first insulating layers 132 include an insulating material such as silicon oxide, and the first electrically conductive material layers 146 include a conductive material, which may comprise at least one metallic material. For example, the first electrically conductive layers 146 can include W, Mo, Ru, Co, Ti, Ta, Cu, or alloys thereof. The total number of repetitions of a pair of a first insulating layer 132 and a first electrically conductive layer 146 within the first alternating stack (132, 146) may be in a range from 2, to 1,024, such as from 8 to 256, although lesser and greater numbers may also be employed. The thickness of each first insulating layer 132 may be in a range from 10 nm to 60 nm, although lesser and greater thicknesses may also be employed. The thickness of each first electrically conductive layer 146 may be in a range from 10 nm to 60 nm, although lesser and greater thicknesses may also be employed.

The first alternating stack (132, 146) may be formed by alternately depositing the first insulating layers 132 and the first electrically conductive layers 146. Alternatively, the first alternating stack (132, 146) may be formed by alternately depositing the first insulating layers 132 and first sacrificial material layers and subsequently replacing the first sacrificial material layers with the first electrically conductive layers 146. In this case, first backside trenches (not illustrated) vertically extending through each layer within the alternating stack of the first insulating layers 132 and the first sacrificial material layers may be employed to provide an isotropic etchant that etches the first sacrificial material layers. The first electrically conductive layers 146 can be formed in cavities formed by removal of the first sacrificial material layers.

First stepped surfaces can be formed by patterning the first alternating stack (132, 146). As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A first stepped cavity is formed within the volume from which portions of the first alternating stack (132, 146) are removed through formation of the first stepped surfaces. A "stepped cavity" refers to a cavity having stepped surfaces. Contact structures are subsequently formed in the region including the first stepped surfaces, and thus, the region including the first stepped surfaces is herein referred to as a contact region 300. Memory stack structures are subsequently formed in a region in which each layer of the first alternating stack (132, 146) is present. The region in which the memory stack structures are subsequently formed is herein referred to as the memory array region 100.

A first retro-stepped dielectric material portion 165 including an insulating fill material can be formed in the first stepped cavity by deposition of a dielectric material therein. For example, a dielectric material such as silicon oxide can be deposited in the first stepped cavity. Excess portions of the deposited dielectric material can be removed from above the horizontal plane including the topmost surface of the first alternating stack (132, 146), for example, by chemical mechanical planarization (CMP). A remaining portion of the deposited dielectric material filling the first stepped cavity constitutes the first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present.

A first insulating cap layer 170 can be formed over the first alternating stack (132, 146) and the first retro-stepped dielectric material portion 165. The set of all structural components between the top surface of the substrate semiconductor layer 10 and the top surface of the first insulating cap layer 170 constitutes a first-tier structure.

Figure 2:
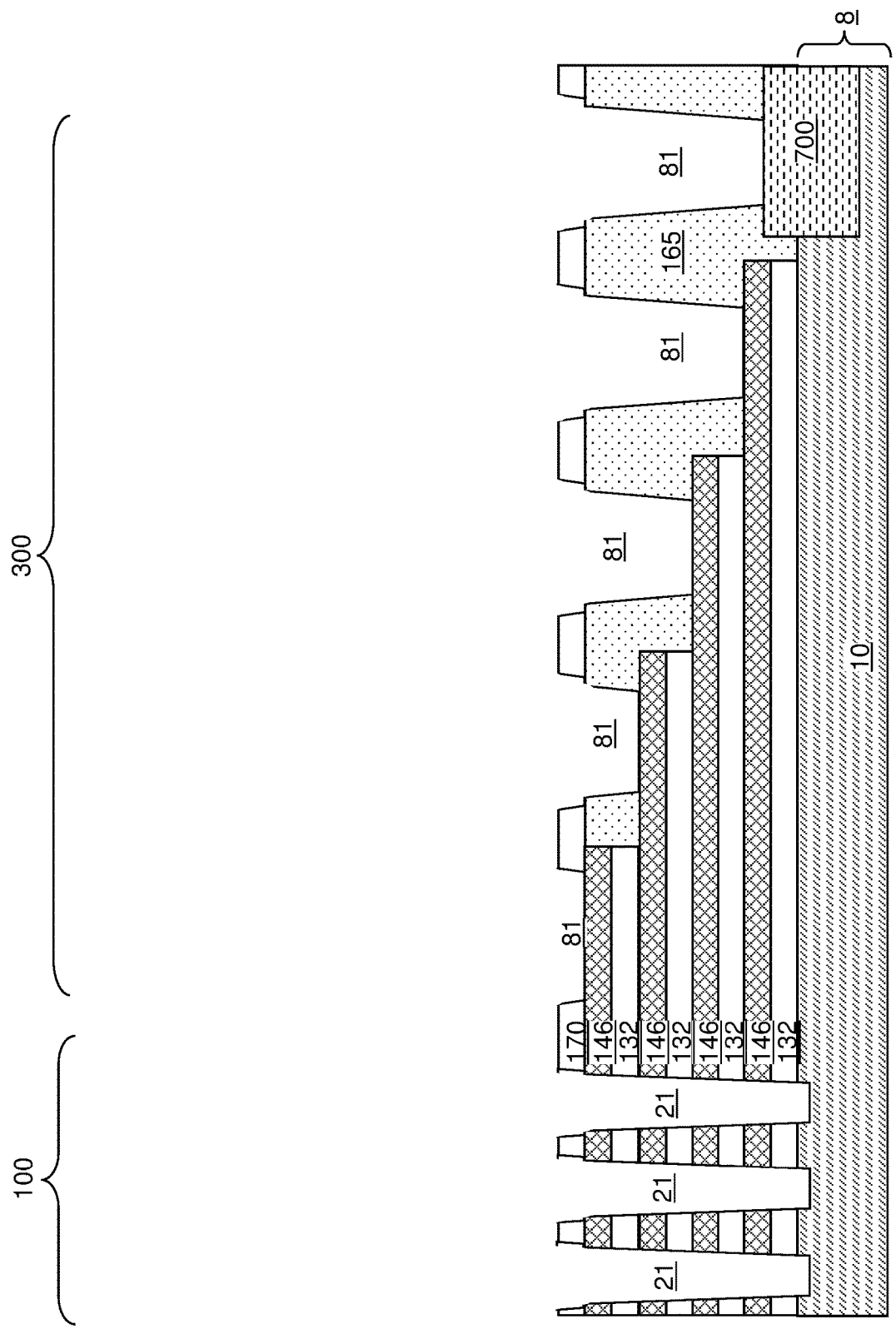
FIG. 2 is a schematic vertical cross-sectional view of the exemplary structure after formation of first-tier memory openings and first-tier contact via cavities according to an embodiment of the present disclosure.

Referring to FIG. 2, a first photoresist layer (not shown) can be applied over the first-tier structure, and can be lithographically patterned to form an array of first openings (such as a two-dimensional periodic array of circular openings) in the memory array region 100. A first anisotropic etch process can be performed to form first-tier memory openings 21 through the first alternating stack (132, 146) in the memory array region 100. The first photoresist layer can be removed, for example, by ashing. In an alternative embodiment, the first-tier memory openings 21 may be formed and filled with a sacrificial material before forming the stepped surfaces.

A second photoresist layer (not shown) can be applied over the first-tier structure, and can be lithographically patterned to form an array of second openings over the stepped surfaces of the first alternating stack (132, 146). A second anisotropic etch process can be performed to form first-tier contact via cavities 81 through the first insulating cap layer 170 and the first retro-stepped dielectric material portion 165. Portions of horizontal surfaces within the first stepped surfaces and nodes of the at least one peripheral semiconductor device 700 may be physically exposed at the bottom of the first-tier contact via cavities 81. The second photoresist layer can be removed, for example, by ashing.

Figure 3:
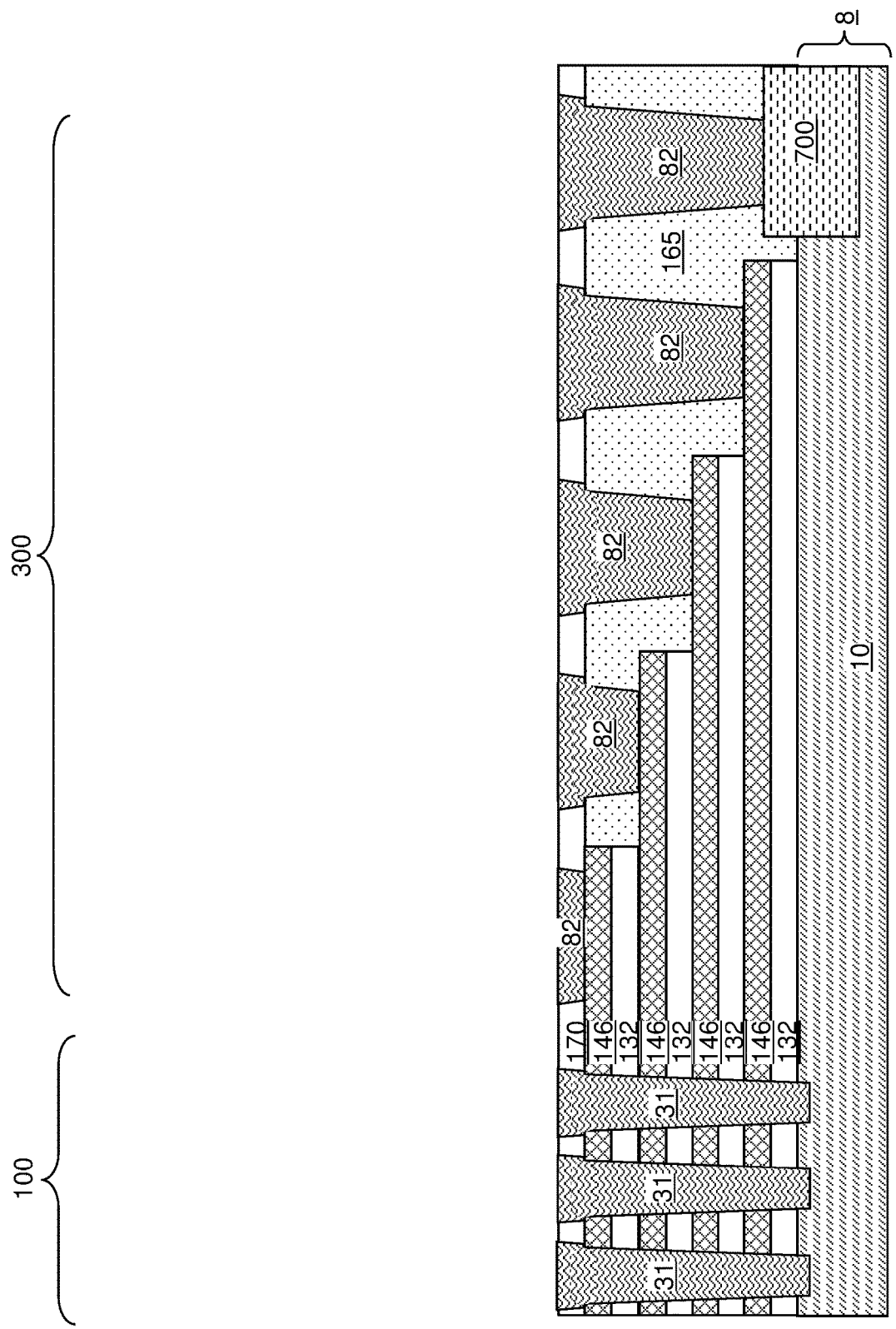
FIG. 3 is a schematic vertical cross-sectional view of the exemplary structure after formation of sacrificial first-tier memory opening fill structures and first-tier conductive pillar structures according to an embodiment of the present disclosure.

Referring to FIG. 3, a sacrificial material can be deposited in the first-tier memory openings 21 and the first-tier contact via cavities 81. The sacrificial material can be deposited in the first-tier memory openings 21 and the first-tier contact via cavities 81 during the same deposition step or during separate deposition steps. The sacrificial material may include amorphous silicon or a silicon-germanium alloy. In one embodiment, the sacrificial material may include a heavily doped semiconductor material (e.g., heavily doped amorphous silicon) including electrical dopants at an atomic concentration greater than $5.0 \times 10^{19}/cm^3$. Excess portions of the sacrificial material can be removed from above the horizontal plane including the top surface of the first insulating cap layer 170 by a planarization process such as a chemical mechanical planarization (CMP) process. Each remaining portion of the sacrificial material filling the first-tier memory openings 21 constitute a sacrificial first-tier memory opening fill structure 31. Each remaining portion of the sacrificial material filling the first-tier contact via cavities 81 constitute a first-tier conductive pillar structure 82. The first-tier conductive pillar structures 82 can contact, and can vertically extend through, the first retro-stepped dielectric material portion 165. A subset of the first-tier conductive pillar structures 82 contacts a top surface of a respective one of the first electrically conductive layers 146.

Figure 4:
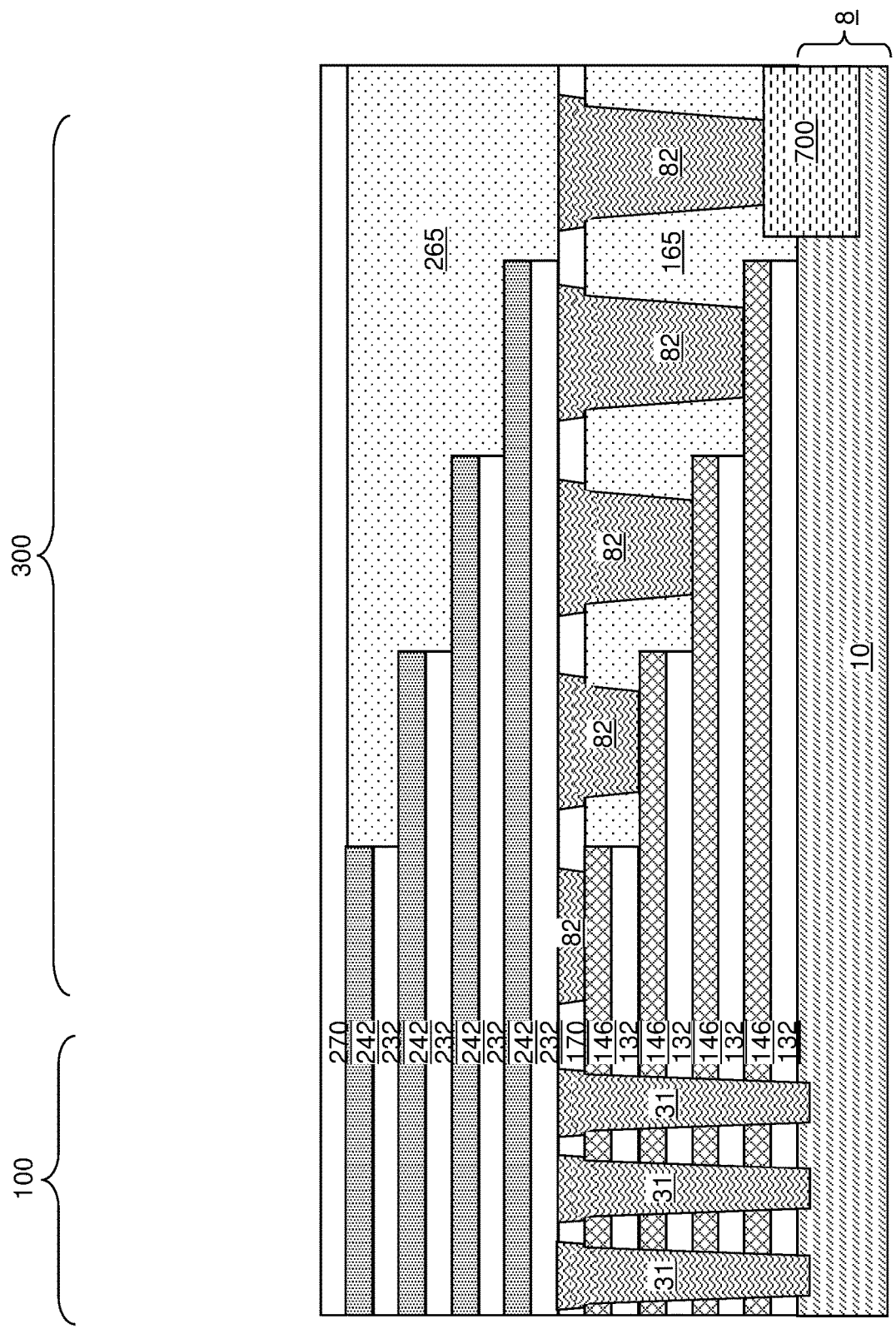
FIG. 4 is a schematic vertical cross-sectional view of the exemplary structure after formation of a second alternating stack of second insulating layers and second sacrificial material layers and a second retro-stepped dielectric material portion according to an embodiment of the present disclosure.

Referring to FIG. 4, a second alternating stack of second insulating layers 232 and sacrificial material layers 242 can be formed over the first-tier structure. The second insulating layers 232 include an insulating material such as silicon oxide, and the sacrificial material layers 242 include a sacrificial material that can be subsequently removed selective to the material of the second insulating layers 232. For example, the sacrificial material layers 242 can include silicon nitride. The total number of repetitions of a pair of a second insulating layer 232 and a sacrificial material layer 242 within the second alternating stack (232, 242) may be in a range from 2, to 2,024, such as from 8 to 256, although lesser and greater numbers may also be employed. The thickness of each second insulating layer 232 may be in a range from 20 nm to 60 nm, although lesser and greater thicknesses may also be employed. The thickness of each sacrificial material layer 242 may be in a range from 20 nm to 60 nm, although lesser and greater thicknesses may also be employed. The second alternating stack (232, 242) may be formed by alternately depositing the second insulating layers 232 and the sacrificial material layers 242.

Second stepped surfaces can be formed by patterning the second alternating stack (232, 242) within the contact region 300. A second stepped cavity is formed within the volume from which portions of the second alternating stack (232, 242) are removed through formation of the second stepped surfaces. Thus, the second stepped surfaces can have an areal overlap with the first stepped surfaces.

A second retro-stepped dielectric material portion 265 including an insulating fill material can be formed in the second stepped cavity by deposition of a dielectric material therein. For example, a dielectric material such as silicon oxide can be deposited in the second stepped cavity. Excess portions of the deposited dielectric material can be removed from above the horizontal plane including the topmost surface of the second alternating stack (232, 242), for example, by chemical mechanical planarization (CMP). A remaining portion of the deposited dielectric material filling the second stepped cavity constitutes the second retro-stepped dielectric material portion 265.

A second insulating cap layer 270 can be formed over the second alternating stack (232, 242) and the second retro-stepped dielectric material portion 265. The set of all structural components between the top surface of the first insulating cap layer 170 and the top surface of the second insulating cap layer 270 constitutes a second-tier structure.

Figure 5:
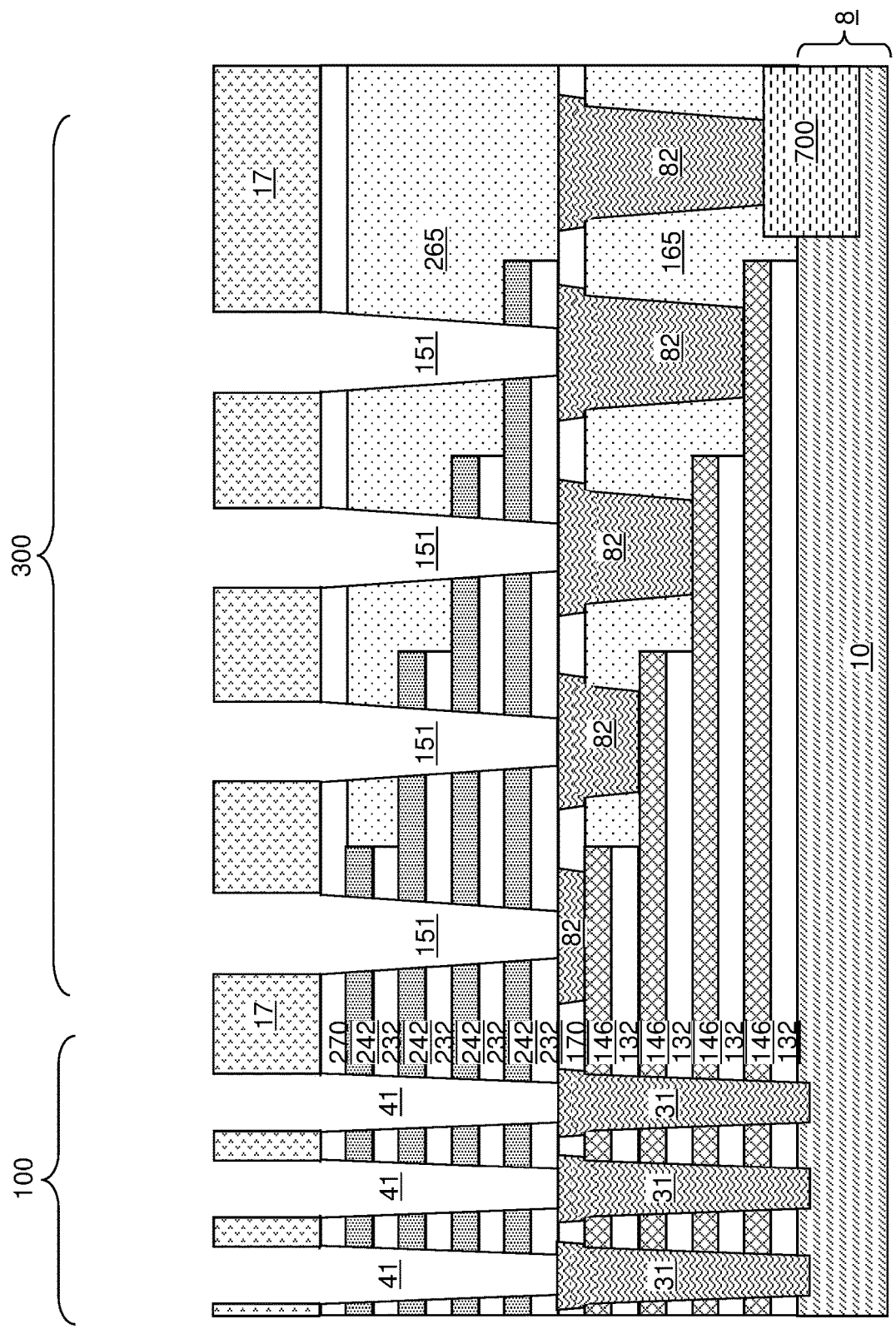
FIG. 5 is a schematic vertical cross-sectional view of the exemplary structure after formation of second-tier memory openings and second-tier contact via cavities according to an embodiment of the present disclosure.

Referring to FIG. 5, a photoresist layer 17 can be applied over the second insulating cap layer 270, and can be lithographically patterned to form an array of first openings (such as a two-dimensional periodic array of circular openings) over the array of sacrificial first-tier memory opening fill structures 31 and to form an array of second openings within areas of the first-tier conductive pillar structures 82. An anisotropic etch process can be performed to transfer the pattern of the openings in the photoresist layer 17 through the second-tier structure. Second-tier memory openings 41 are formed through the second alternating stack (232, 242) in the memory array region 100 over and exposing a respective one of the sacrificial first-tier memory opening fill structure 31. Second-tier contact via cavities 151 can be formed through the second-tier structure extending to a top surface of a respective one of the first-tier conductive pillar structures 82. In one embodiment, a periphery of a bottom surface of each second-tier contact via cavity 151 can be laterally offset inward from a periphery of a top surface of an underlying one of the first-tier conductive pillar structures 82. In other words, the diameter of the bottom of each cavity 151 can be smaller than a diameter of the top of each respective structure 82. The photoresist layer may be removed, for example, by ashing.

Figure 6:
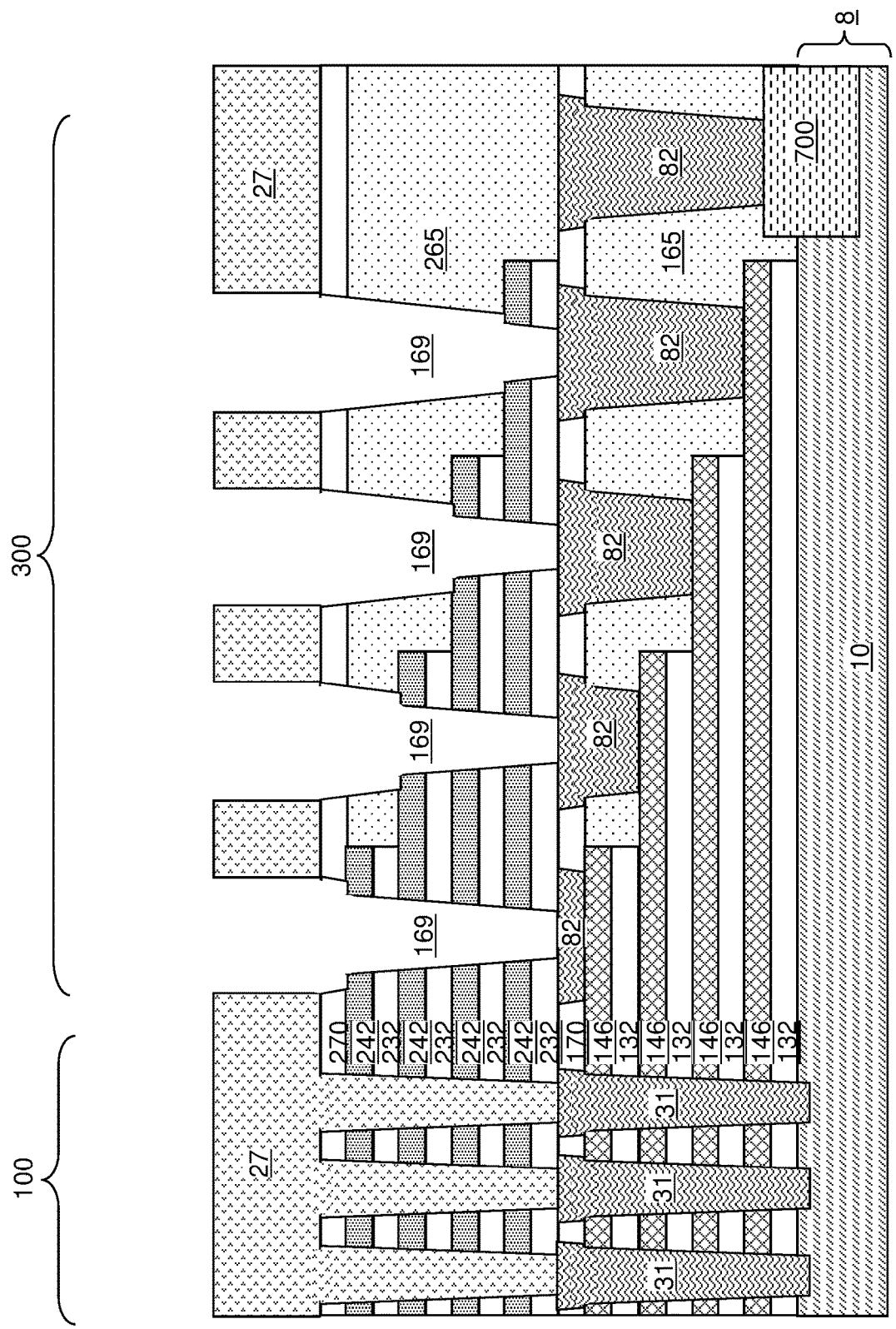
FIG. 6 is a schematic vertical cross-sectional view of the exemplary structure after formation of stepped contact via cavities according to an embodiment of the present disclosure.

Referring to FIG. 6, another photoresist layer 27 can be applied over the second-tier structure, and can be lithographically patterned to cover the memory array region 100 without covering the entire contact region 300. In one embodiment the photoresist layer 27 may be removed over the entire contact region 300. In another embodiment shown in FIG. 6, portions of the photoresist layer 27 may remain in the contact region 300, but include an array of discrete openings over the cavities 151, where the openings have a larger diameter than the cavities 151. In other words, the openings in the contact region 300 may have a respective periphery that is laterally offset outward from an upper periphery of a respective one of the second-tier contact via cavities 151.

According to an aspect of the present disclosure, an isotropic etch process (where there is no photoresist layer 27 in the contact region 300) or an anisotropic etch process (where the photoresist layer 27 is located with openings in the contact region 300) can be performed to etch the material of the second retro-stepped dielectric material portion 265 selective to the material of the sacrificial material layers 242. Thus, an upper portion of each second-tier contact via cavity 151 can be expanded relative to the lower portion of each second-tier contact via cavity 151, and the second-tier contact via cavities 151 are converted into stepped contact via cavities 169. Each stepped contact via cavity 169 includes an upper portion extending through the second retro-stepped dielectric material portion 265, and a lower portion extending through a subset of layers within the second alternating stack (232, 242). A cylindrical sidewall of the upper portion of each stepped contact via cavity 169 can be connected to a cylindrical sidewall of the lower portion of the stepped contact via cavity 169 by an annular upper surface portion of one of the sacrificial material layers 242. In other words, a portion of the horizontal surface of one layer 242 is exposed in each respective cavity 169. The photoresist layer 27 can be removed, for example, by ashing.

Figure 7:
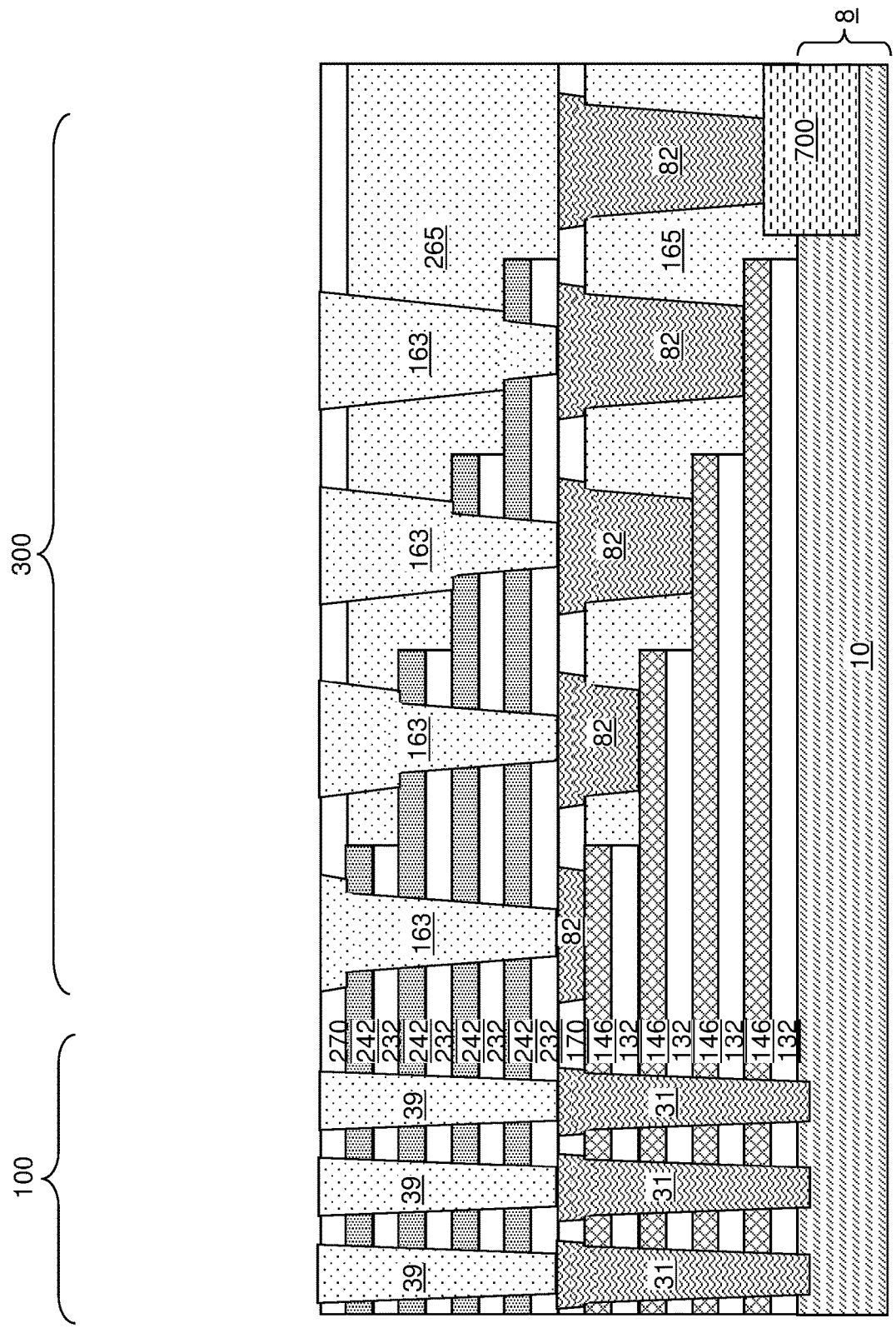
FIG. 7 is a schematic vertical cross-sectional view of the exemplary structure after formation of sacrificial second-tier memory opening fill structures and sacrificial contact via fill structures according to an embodiment of the present disclosure.

Referring to FIG. 7, an optional second sacrificial fill material can be deposited in the second-tier memory openings and the stepped contact via cavities 169. The sacrificial fill material includes a material that can be removed selective to the materials of the second-tier structure and the first-tier conductive pillar structures 82. For example, the sacrificial fill material may include undoped amorphous silicon, a silicon-germanium alloy including germanium at an atomic concentration greater than 40%, amorphous carbon or diamond-like carbon (DLC), borosilicate glass, organosilicate glass, or a polymer material. Excess portions of the sacrificial fill material can be removed from the horizontal plane including the top surface of the second insulating cap layer 270 by a planarization process such as a chemical mechanical planarization (CMP) process. Each remaining portion of the sacrificial fill material that fills a second-tier memory opening constitutes a sacrificial second-tier memory opening fill structure 39. Each remaining portion of the sacrificial fill material that fills the stepped contact via cavities 169 constitutes a sacrificial contact via fill structure 163.

Figure 8:
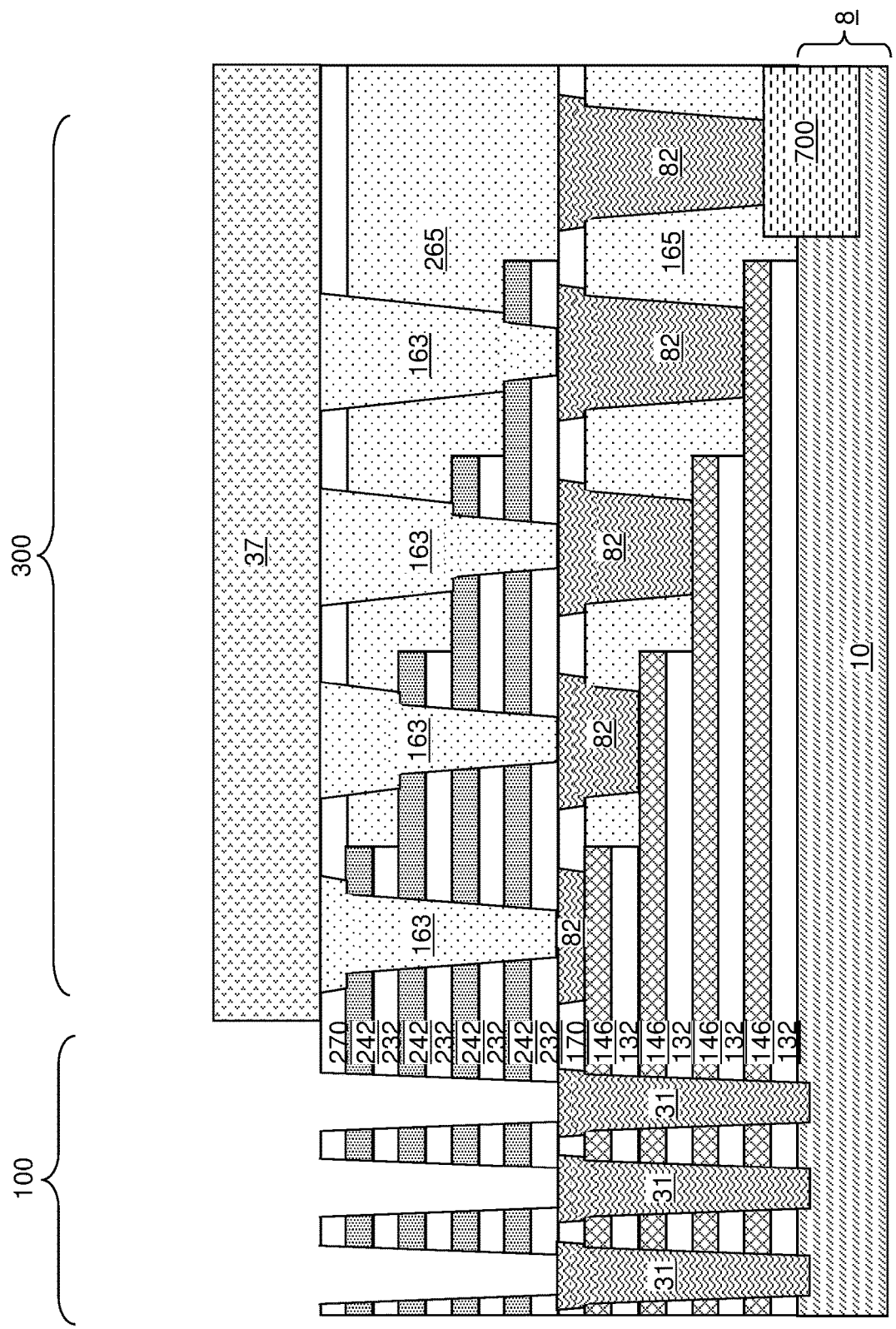
FIG. 8 is a schematic vertical cross-sectional view of the exemplary structure after removal of the sacrificial second-tier memory opening fill structures according to an embodiment of the present disclosure.

Referring to FIG. 8, a photoresist layer 37 can be applied over the second-tier structure, and can be lithographically patterned to cover the contact region 300 while not covering the memory array region 100. An etch process that etches the material of the sacrificial second-tier memory opening fill structure 39 selective to the materials of the second alternating stack (232, 242) and the second insulating cap layer 270 can be performed to remove the sacrificial second-tier memory opening fill structure 39. Voids are formed within the volumes of the second-tier memory openings 41.

Figure 9:
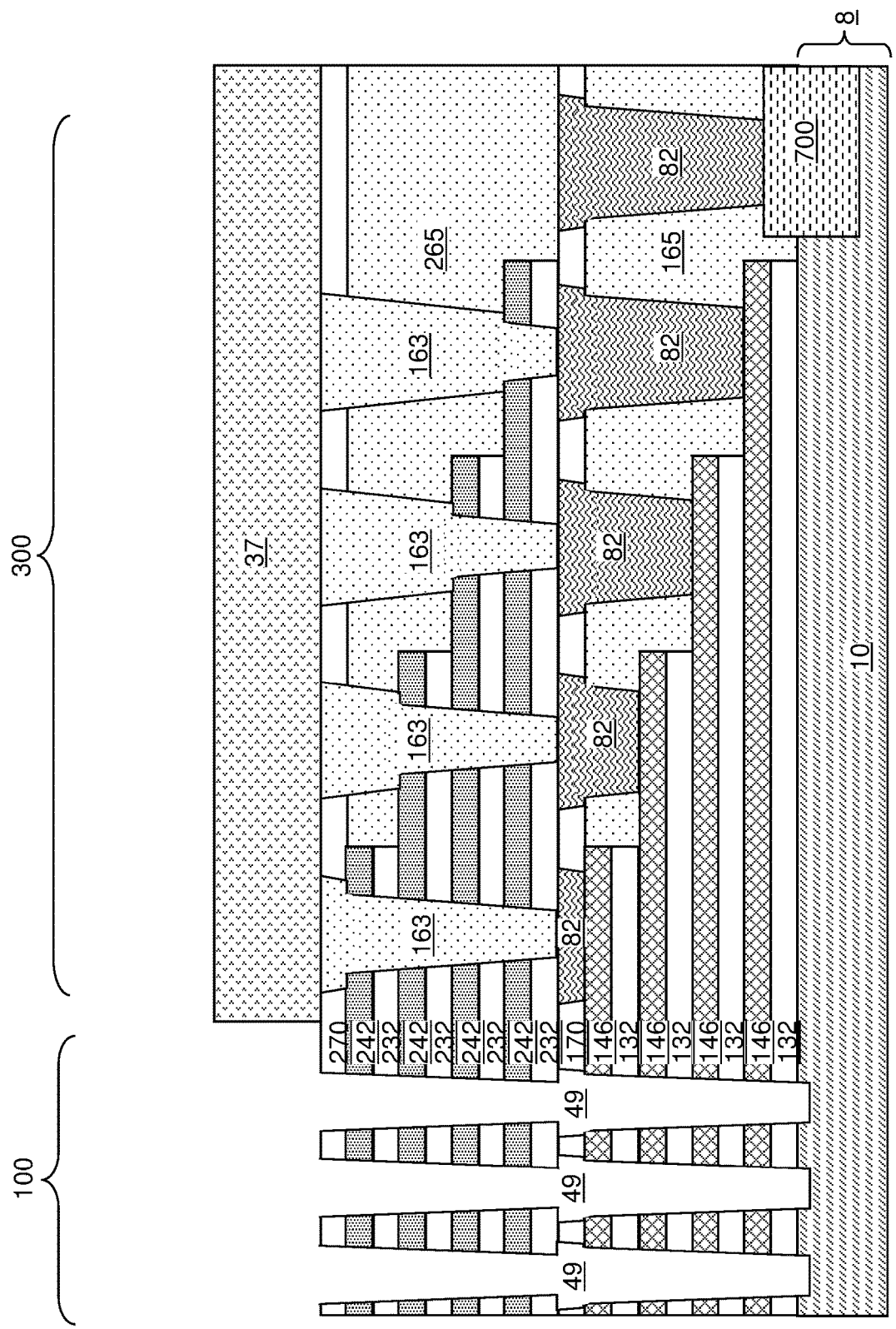
FIG. 9 is a schematic vertical cross-sectional view of the exemplary structure after formation of inter-tier memory openings according to an embodiment of the present disclosure.

Referring to FIG. 9, another etch process that etches the material of the sacrificial first-tier memory opening fill structure 31 selective to the materials of the second alternating stack (232, 242), the first alternating stack (132, 146), the second insulating cap layer 270, and the first insulating cap layer 170 can be performed to remove the sacrificial first-tier memory opening fill structure 31. Voids are formed within the volumes of the second-tier memory openings and the first-tier memory openings. Each contiguous void that vertically extends through the first alternating stack (132, 146) and the second alternating stack (232, 242) constitutes an inter-tier memory opening 49, which is a memory opening 49 in which a memory stack structure is subsequently formed. The photoresist layer 37 can be subsequently removed, for example, by ashing.

FIGS. 10A-10F illustrate structural changes in a memory opening 49, which is one of the memory openings 49 in the exemplary structure of FIG. 9. The same structural change occurs simultaneously in each of the other memory openings 49.

Referring to FIG. 10A, a memory opening 49 in the exemplary device structure of FIG. 9 is illustrated. The memory opening 49 extends through second-tier structure and the first-tier structure, and optionally into an upper portion of the substrate semiconductor layer 10. The recess depth of the bottom surface of each memory opening 49 with respect to the top surface of the substrate semiconductor layer 10 can be in a range from 0 nm to 30 nm, although greater recess depths can also be employed.

Referring to FIG. 10B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the substrate semiconductor layer 10. In one embodiment, the pedestal channel portion 11 can be doped with electrical dopants of the same conductivity type as the substrate semiconductor layer 10. The pedestal channel portion 11 can be a portion of a transistor channel that extends between a source region to be subsequently formed in the substrate 8 and a drain region to be subsequently formed in an upper portion of the memory opening 49. In one embodiment, the pedestal channel portion 11 can comprise single crystalline silicon. In one embodiment, the pedestal channel portion 11 can have a doping of the first conductivity type, which is the same as the conductivity type of the substrate semiconductor layer 10 that the pedestal channel portion 11 contacts.

A memory film 50 can be formed. The memory film 50 includes a stack of layers, which may include a blocking dielectric layer 52, a charge storage layer 54, and a tunneling dielectric layer 56. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into the first electrically conductive layers 146 and/or into the sacrificial material layers 242. In one embodiment, the charge storage layer 54 includes a silicon nitride layer. The charge storage layer 54 can be formed as a single charge storage layer of homogeneous composition, or can include a stack of multiple charge storage layers. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Referring to FIG. 10C, an anisotropic etch process can be performed to remove horizontal portions of the memory film 50. A top surface of a pedestal channel portion 11 or a top surface of the substrate semiconductor layer 10 (in case pedestal channel portions 11 are not employed) can be physically exposed at the bottom of each memory opening 49.

Referring to FIG. 10D, a semiconductor channel layer 60L can be conformally deposited. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 40 nm, although lesser and greater thicknesses can also be employed. A memory cavity 49' is formed in the volume of each memory opening 49 that is not filled with the deposited material layers (52, 54, 56, 60L).

Referring to FIG. 10E, a dielectric fill material can be deposited in the memory cavity 49' to fill the memory cavity 49' within each memory opening 49. The dielectric fill material may be, for example, silicon oxide or organosilicate glass. The dielectric fill material can be deposited by a conformal deposition method such as low pressure chemical vapor deposition (LPCVD), or by a self-planarizing deposition process such as spin coating.

The dielectric fill material can be recessed, for example, by a recess etch such that each remaining portion of the dielectric fill material has a top surface located below the horizontal plane including the top surface of the second insulating cap layer 270. Each remaining portion of the dielectric fill material constitutes a dielectric core 62.

Referring to FIG. 10F, a doped semiconductor material having a doping of a second conductivity type can be deposited within the recess that overlies the dielectric core 62. The second conductivity type that is the opposite of the first conductivity type. For example, if the first conductivity type is p-type, the second conductivity type is n-type, and vice versa. Portions of the doped semiconductor material and the semiconductor channel layer 60L located above the horizontal plane including the top surface of the second insulating cap layer 270 can be removed by a planarization process, which may employ a chemical mechanical planarization process and/or a recess etch process. Remaining portions of the doped semiconductor material having a doping of the second conductivity type constitute drain regions 63. The dopant concentration in the drain regions 63 can be in a range from $5.0 \times 10^{18}/cm^3$ to $2.0 \times 10^{21}/cm^3$, although lesser and greater dopant concentrations can also be employed. The doped semiconductor material can be, for example, doped polysilicon. Each remaining portion of the semiconductor channel layer 60L located within a memory opening 49 constitutes a vertical semiconductor channel 60.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58.

Figure 11:
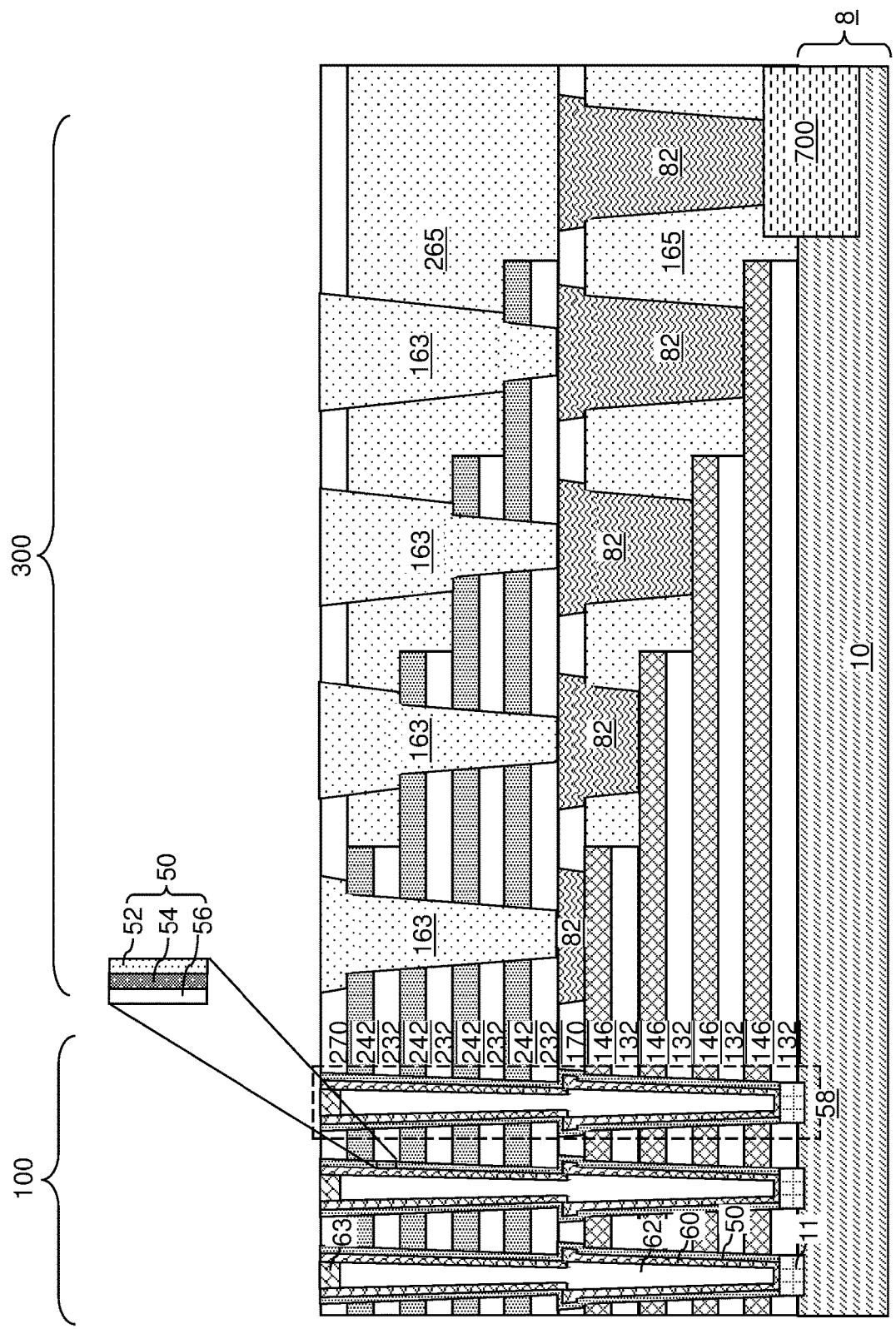
FIG. 11 is a schematic vertical cross-sectional view of the exemplary structure after formation of memory stack structures and support pillar structures according to an embodiment of the present disclosure.

Referring to FIG. 11, the exemplary structure is illustrated after formation of memory opening fill structures 58 within the memory openings 49. An inset illustrates that each memory film 50 can include a layer stack of a blocking dielectric layer 52, a charge storage layer 54, and a tunneling dielectric layer 56. Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (comprising portions of the charge storage layer 54) and an optional blocking dielectric layer 52. Generally, each memory film 50 can include a vertical stack of memory elements, which may be portions of the charge storage layer 54 or may be a vertical stack of discrete memory elements (e.g., floating gates) located at levels of the first electrically conductive layers 146 and the sacrificial material layers 242. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 12:
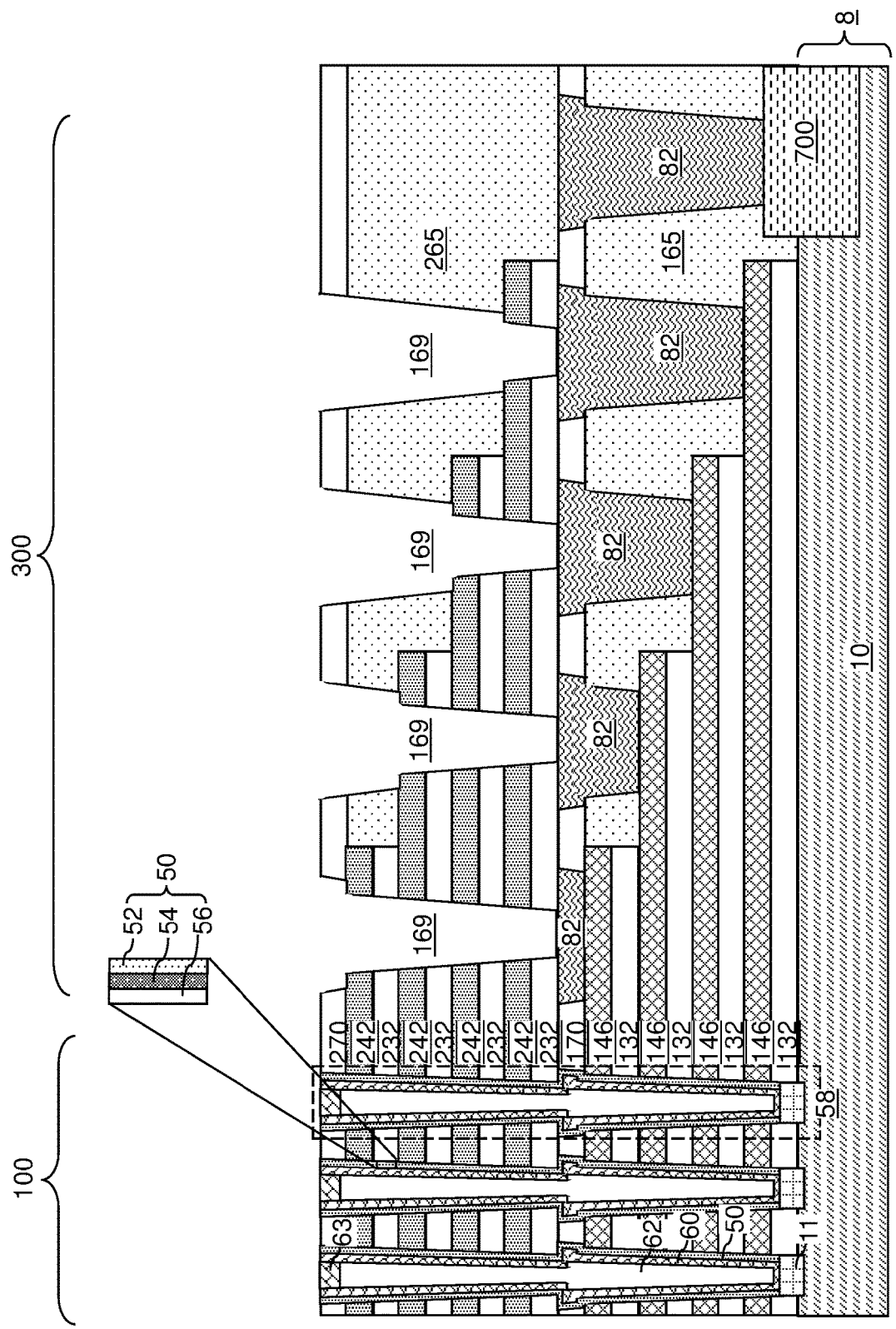
FIG. 12 is a schematic vertical cross-sectional view of the exemplary structure after formation of voids within the stepped contact via cavities according to an embodiment of the present disclosure.

Referring to FIG. 12, the sacrificial contact via fill structures 163 can be removed selective to the second alternating stack (232, 242), the second insulating cap layer 270, the second retro-stepped dielectric material portion 265, and the first-tier conductive pillar structures 82. Voids are formed within the volumes of the stepped contact via cavities 169. The stepped contact via cavities 169 extend vertically through the second-tier structure, and specifically through the second insulating cap layer 270, the second retro-stepped dielectric material portion 265, and a respective subset of the second alternating stack (232, 242). Each stepped contact via cavity 169 comprises an upper portion overlying a subset of layers within the second alternating stack (232, 242) and a lower portion extending through a different subset of layers within the second alternating stack (232, 242). A top surface of a first-tier conductive pillar structure 82 can be physically exposed at the bottom of each stepped contact via cavity 169.

Figure 13:
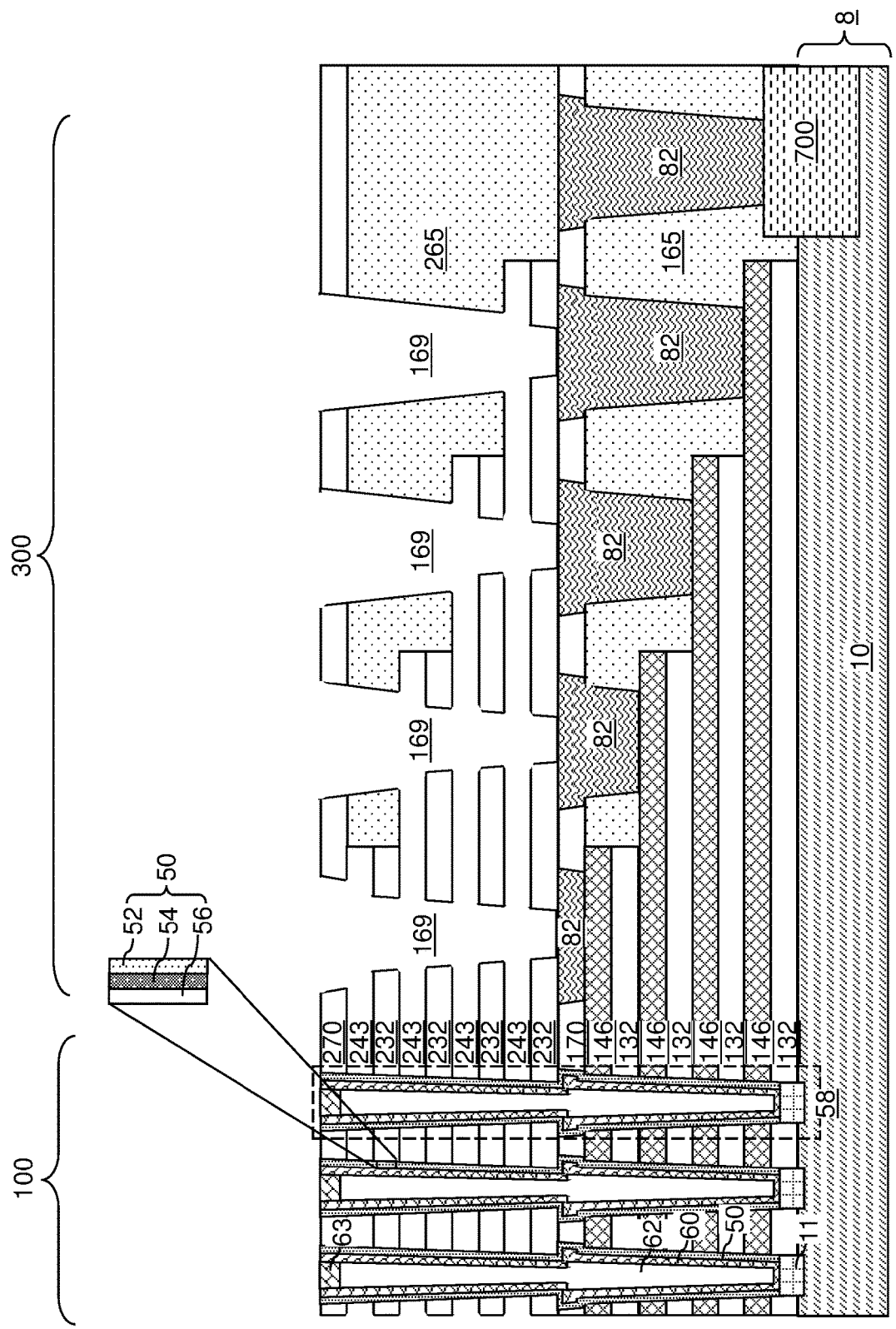
FIG. 13 is a schematic vertical cross-sectional view of the exemplary structure after formation of backside recesses according to an embodiment of the present disclosure.

Referring to FIG. 13, an isotropic etchant that selectively etches the material of the sacrificial material layers 242 with respect to the materials of the second insulating layers 32, the second insulating cap layer 270, the second retro-stepped dielectric material portion 265, the outermost layer of each memory opening fill structure 58 (such as the blocking dielectric layers 52), and the first-tier conductive pillar structures 82 can be introduced into the stepped contact via cavities 169, for example, employing an isotropic etch process. Thus, removal of the material of the sacrificial material layers 242 can be selective to the materials of the second insulating layers 232, the second insulating cap layer 270, the second retro-stepped dielectric material portion 265, the outermost layer of each memory opening fill structure 58 (such as the blocking dielectric layers 52), and the first-tier conductive pillar structures 82. In one embodiment, the sacrificial material layers 242 can include silicon nitride, and the materials of the second insulating layers 32, the second insulating cap layer 270, the second retro-stepped dielectric material portion 265 can be silicon oxide-based materials.

The etch process can be a wet etch process employing a wet etch solution, or can be a gas phase (dry) etch process in which the etchant is introduced in a vapor phase into the stepped contact via cavities 169. For example, if the sacrificial material layers 242 include silicon nitride, the etch process can be a wet etch process in which the exemplary structure is immersed within a wet etch tank including phosphoric acid, which etches silicon nitride selective to silicon oxide, silicon, and various other materials employed in the art.

Each backside recess 243 can be a laterally extending cavity having a lateral dimension that is greater than the vertical extent of the cavity. In other words, the lateral dimension of each backside recess 243 can be greater than the height of the backside recess 243. A plurality of backside recesses 243 can be formed in the volumes from which the sacrificial material layers 242 are removed. The memory openings in which the memory stack structures 55 are formed are herein referred to as front side openings or front side cavities in contrast with the backside recesses 243. In one embodiment, the memory array region 100 comprises an array of monolithic three-dimensional NAND strings having a plurality of device levels disposed above the substrate 8. In this case, each backside recess 243 can define a space for receiving a respective word line of the array of monolithic three-dimensional NAND strings.

Each of the plurality of backside recesses 243 can extend substantially parallel to the top surface of the substrate 8. A backside recess 243 can be vertically bounded by a top surface of an underlying insulating layer 32 and a bottom surface of an overlying insulating layer 32. In one embodiment, each backside recess 243 can have a uniform height throughout.

Figure 14:
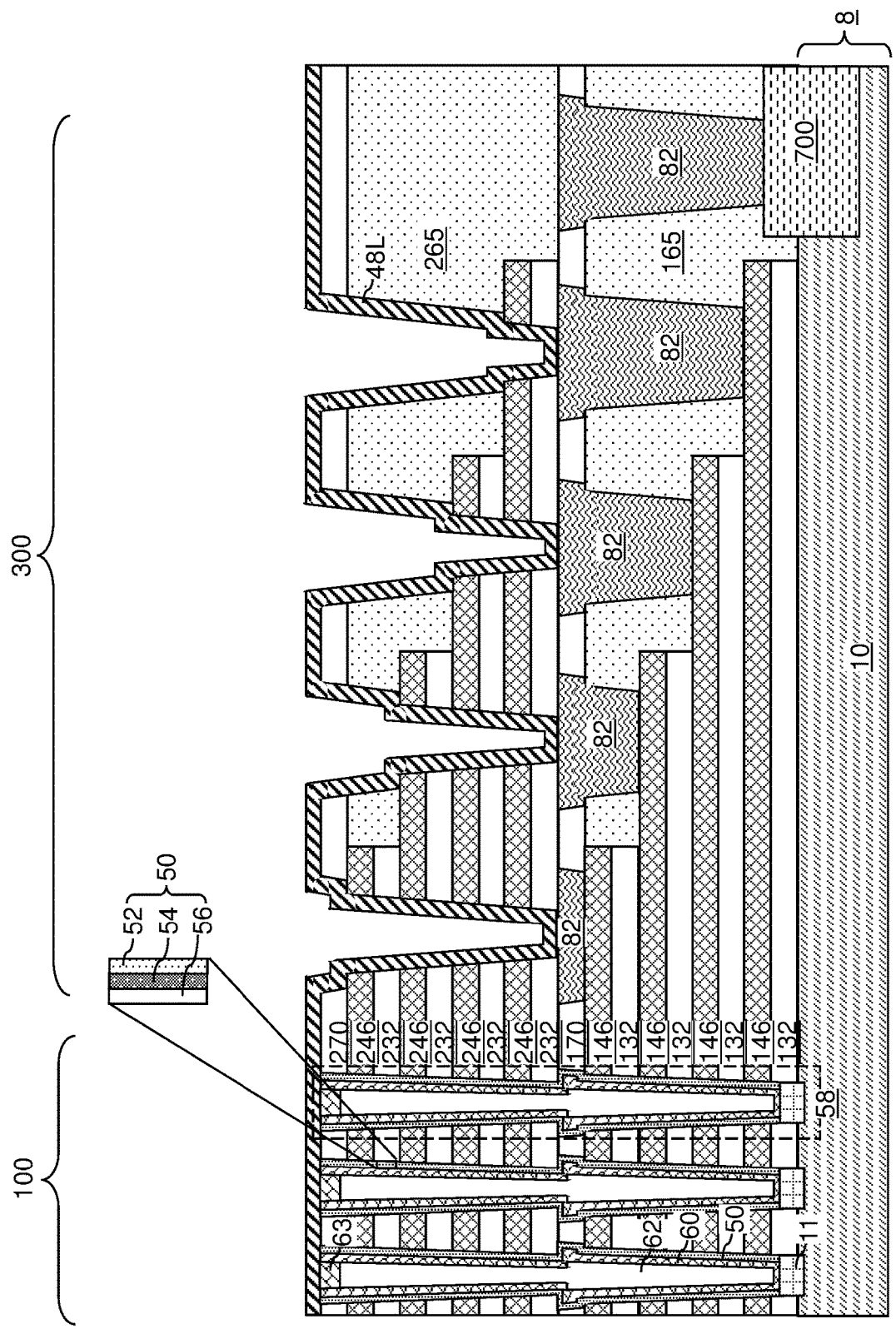
FIG. 14 is a schematic vertical cross-sectional view of the exemplary structure after formation of a continuous metallic material layer according to an embodiment of the present disclosure.

Referring to FIG. 14, a backside blocking dielectric layer (not shown) may be optionally formed by a conformal deposition process. The backside blocking dielectric layer, if present, comprises a dielectric material, such as aluminum oxide, that functions as a blocking dielectric for the control gates to be subsequently formed in the backside recesses 243.

A continuous metallic material layer 48L can be formed by depositing at least one metallic material in the backside recesses 243 and at a periphery of each of the stepped contact via cavities 169. The at least one metallic material can include, for example, a combination of a metallic barrier layer and a metallic fill material.

The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material can be selected, for example, from tungsten, cobalt, ruthenium, titanium, and tantalum. In one embodiment, the metallic fill material can consist essentially of a single elemental metal.

Portions of the continuous metallic material layer 48L that fill the backside recesses 243 constitute second electrically conductive layers 246. Portions of the continuous metallic material layer 48L located inside the stepped contact via cavities 169 or over the top surface of the second insulating cap layer 270 may be interconnected among one another without any opening therethrough. The second-tier structure includes a second alternating stack of the second insulating layers 232 and the second electrically conductive layers 246. Each second electrically conductive layer 246 is a portion of the continuous metallic material layer 48L.

Figure 15:
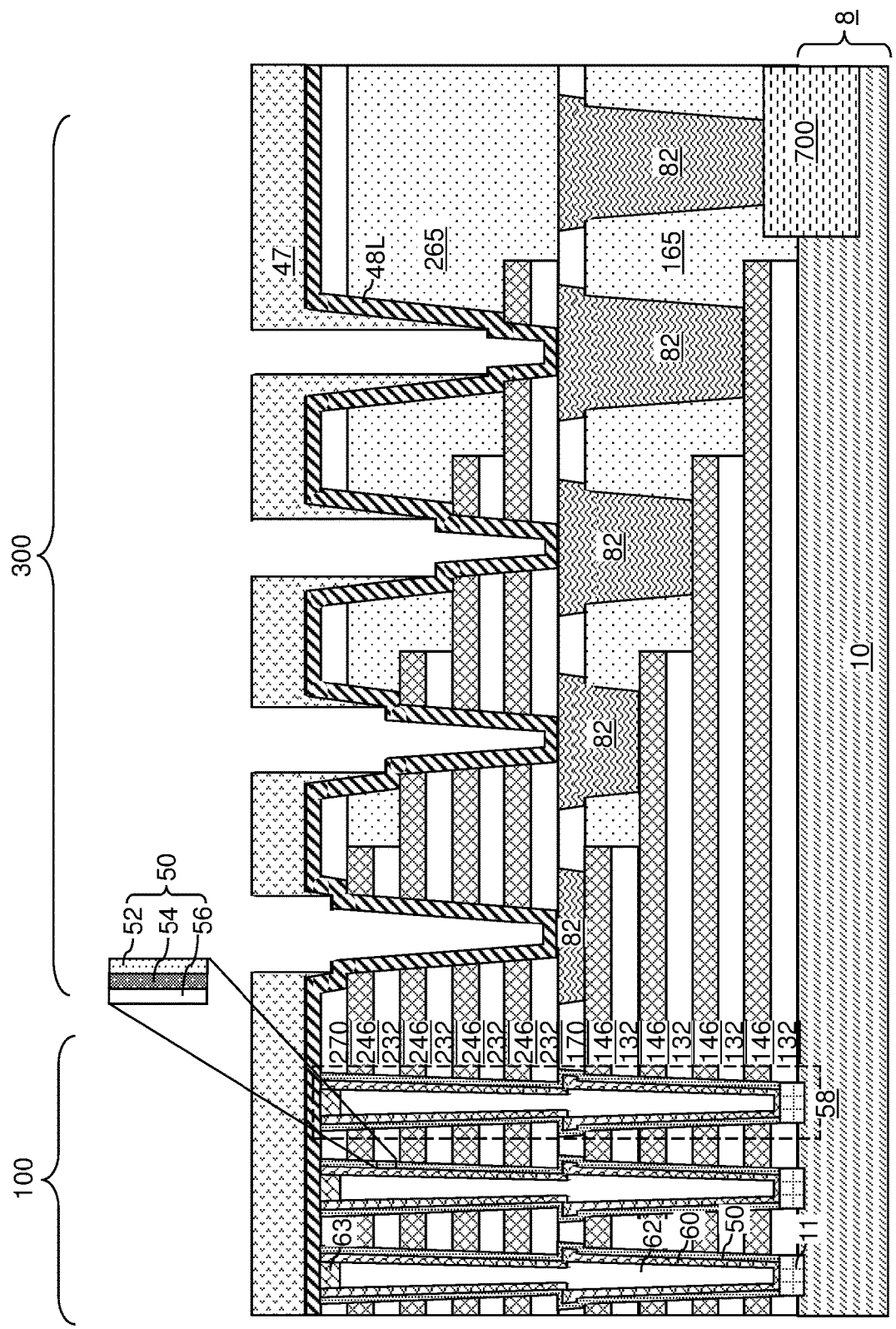
FIG. 15 is a schematic vertical cross-sectional view of the exemplary structure after formation of a patterned photoresist layer according to an embodiment of the present disclosure.

Referring to FIG. 15, an optional patterned photoresist layer 47 can be formed over the continuous metallic material layer 48L. The patterned photoresist layer 47 can include openings over each stepped contact via cavity 169 such that a periphery of each opening in the patterned photoresist layer 47 is laterally offset inward from a periphery of an upper portion of a respective underlying stepped contact via cavity 169. In one embodiment, each opening in the patterned photoresist layer 47 can have a periphery located at or about a periphery of a lower portion an underlying stepped contact via cavity 169. In one embodiment, the patterned photoresist 47 can include downward-extending portions that cover portions of the continuous metallic material layer 48L located on sidewalls of the second retro-stepped dielectric material portion 265.

Figure 16:
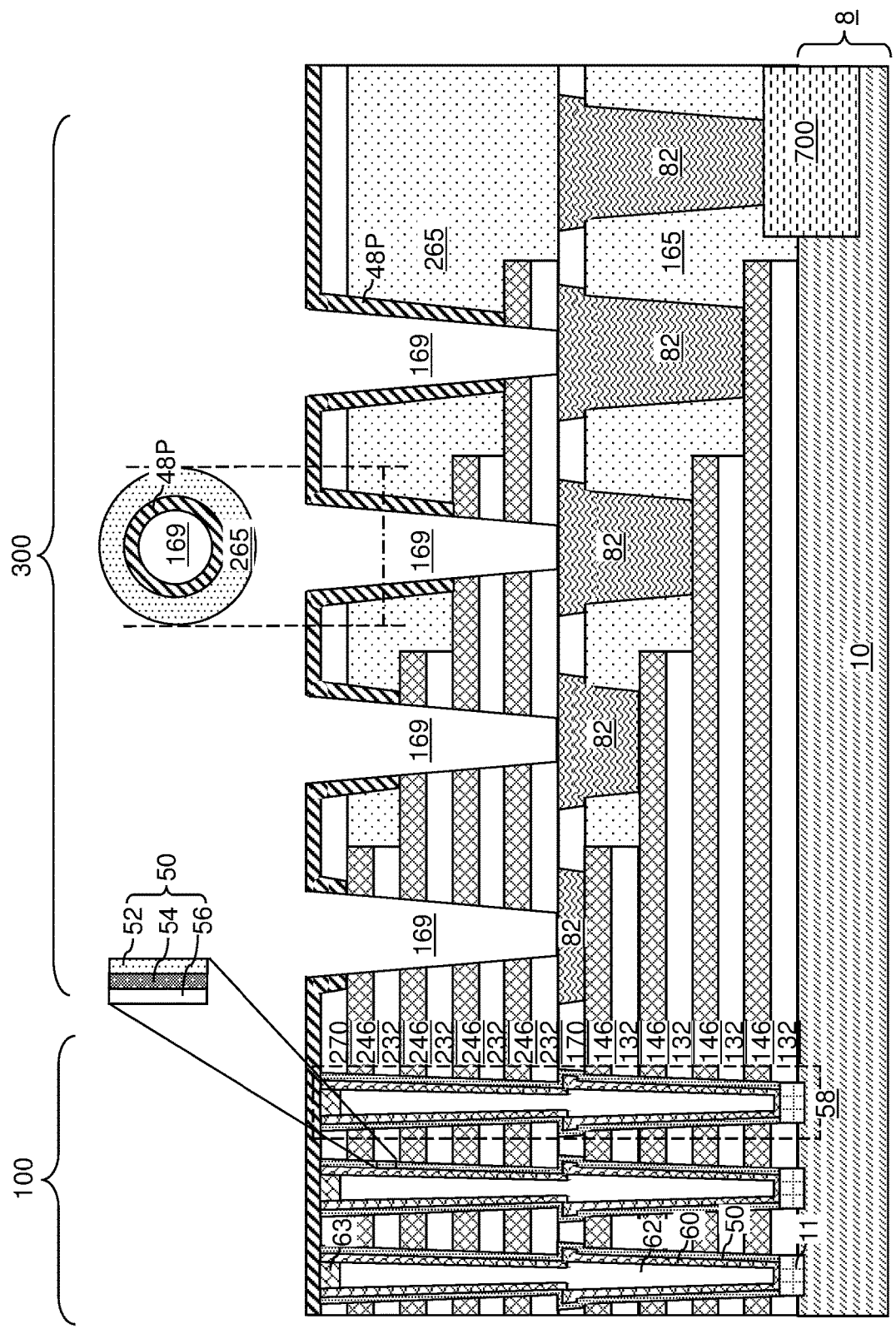
FIG. 16 is a schematic vertical cross-sectional view of the exemplary structure after removing unmasked portions of the continuous metallic material layer according to an embodiment of the present disclosure.

Referring to FIG. 16, an etch process is performed to remove unmasked portions of the continuous metallic material layer 48L. Portions of the continuous metallic material layer 48L located in lower portions of the stepped contact via cavities 169 can be removed by the etch process. In other words, the continuous metallic material layer 48L is removed from an entire volume of each lower portion of the stepped contact cavities 169. The etch process may employ an anisotropic etch process and/or an isotropic etch process. Remaining patterned portions of the continuous metallic material layer 48L comprise the second electrically conductive layers 246 located in the backside recesses 243, and a perforated metallic material layer 48P that includes a horizontally-extending portion that overlies the second insulating cap layer 270 and tubular metallic structures located in the upper portions of the stepped contact via cavities 169. A horizontal cross-section view of a region of a stepped contact via cavity 169 is illustrated in an inset. The patterned photoresist layer 47 can be subsequently removed, for example, by ashing. In an alternative embodiment, the formation of the photoresist layer 47 may be omitted, and the electrically conductive layers 246 and the perforated metallic material layer 48P may be formed using an anisotropic sidewall spacer etch.

Figure 17:
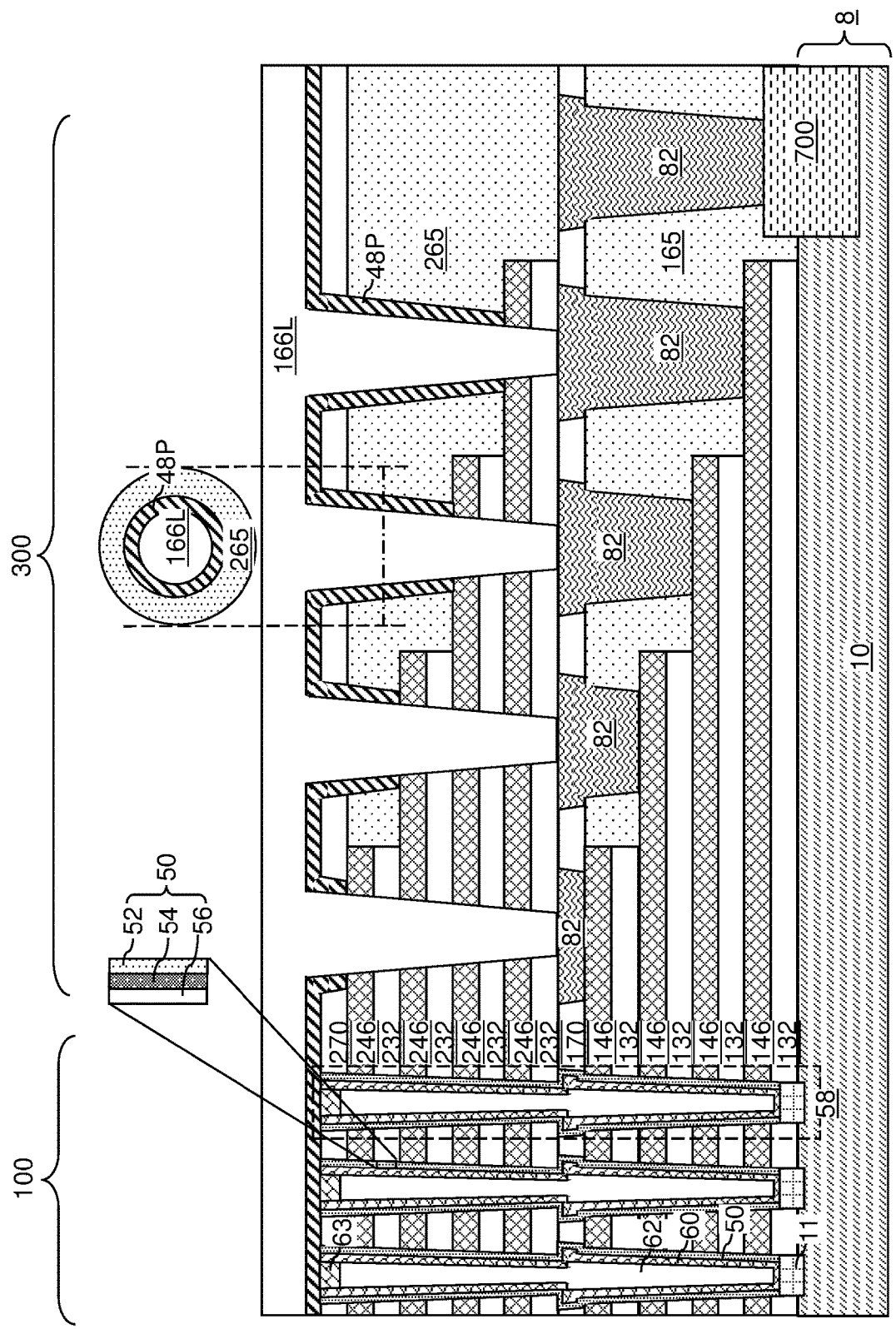
FIG. 17 is a schematic vertical cross-sectional view of the exemplary structure after formation of a dielectric fill material layer according to an embodiment of the present disclosure.

Referring to FIG. 17, a dielectric fill material layer 166L can be deposited in the stepped contact via cavities 169 on the perforated metallic material layer 48P. The dielectric fill material layer 166L includes a dielectric fill material such as silicon oxide. The dielectric fill material can be deposited in each void in the stepped contact via cavities 169. The dielectric fill material layer 166L can be deposited by a conformal deposition process (such as chemical vapor deposition) or by spin coating. A horizontal cross-section view of a region of a stepped contact via cavity 169 is illustrated in an inset.

Figure 18:
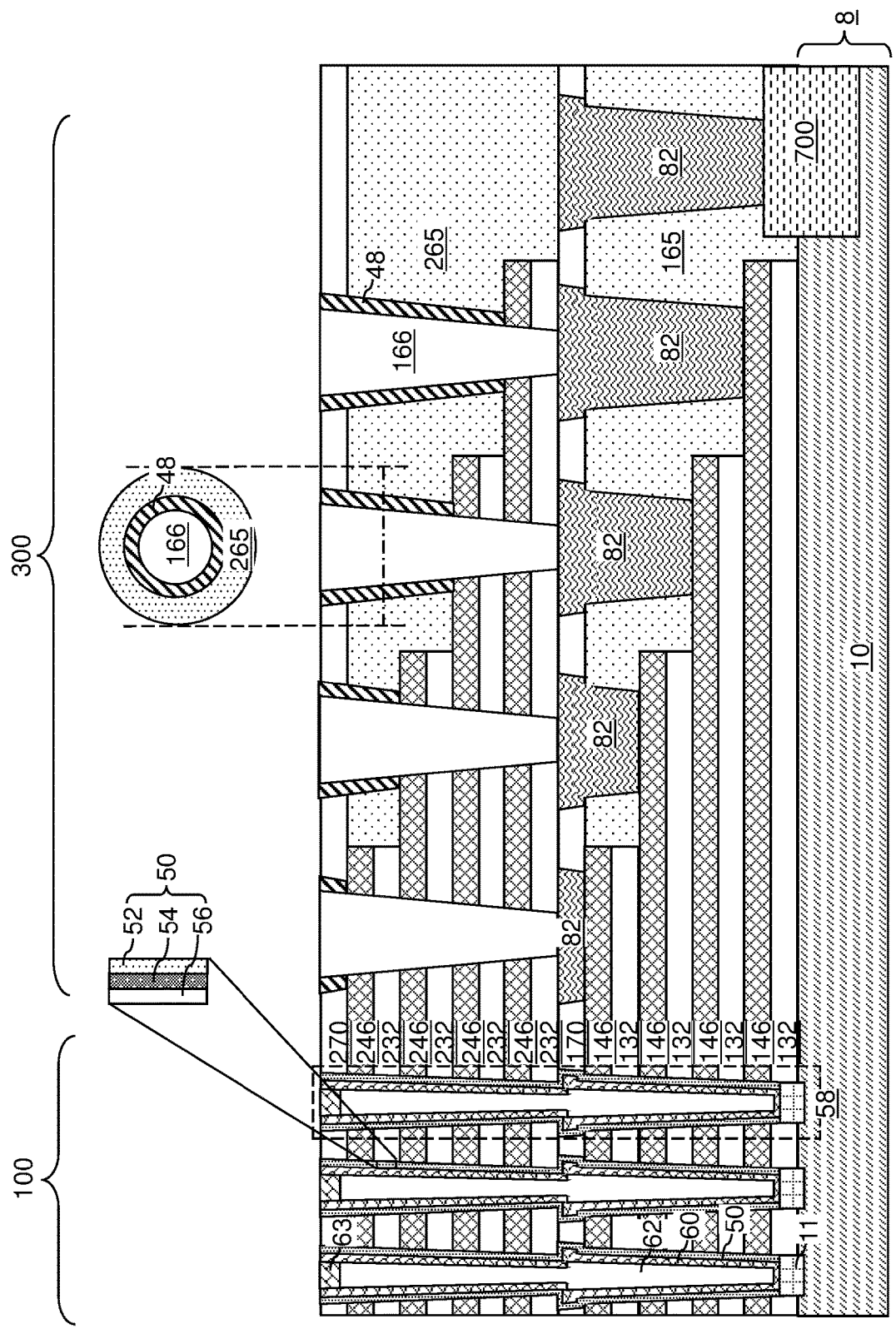
FIG. 18 is a schematic vertical cross-sectional view of the exemplary structure after formation of tubular contact via structures and insulating plugs according to an embodiment of the present disclosure.

Referring to FIG. 18, a planarization process can be performed to remove horizontal portions of the perforated metallic material layer 48P and the dielectric fill material layer 166L that are located above the horizontal plane including the top surface of the second insulating cap layer 270. For example, a chemical mechanical planarization (CMP) process and/or a recess etch process can be performed to remove the horizontal portions of the perforated metallic material layer 48P and the dielectric fill material layer 166L that are located above the horizontal plane including the top surface of the second insulating cap layer 270. Each remaining portion of the perforated metallic material layer 48P located outside the volumes of the backside recesses 243 and inside the volume of a respective one of the stepped contact via cavities 169 constitutes a tubular contact via structure 48 having a tubular configuration. Each tubular contact via structure 48 is adjoined to a respective one of the second electrically conductive layers 246 Each remaining portion of the dielectric fill material layer 166L located within a respective one of the stepped contact via cavities 169 constitutes an insulating plug 166.

Generally, remaining patterned portions of the continuous metallic material layer 48L comprise second electrically conductive layers 246 located in the backside recesses 243 and tubular contact via structures 48 adjoined to a respective one of the second electrically conductive layers 246 and located within a respective one of the stepped contact via cavities 169. Each tubular contact via structure 48 can be adjoined to only a respective one of the second electrically conductive layers 246, and can be electrically isolated from all other second electrically conductive layers 246. Each insulating plug 166 can be formed within a respective stepped contact via cavity 169 on an inner sidewall of a tubular contact via structure 48. A horizontal cross-section view of a region of a stepped contact via cavity 169 is illustrated in an inset.

Figure 19:
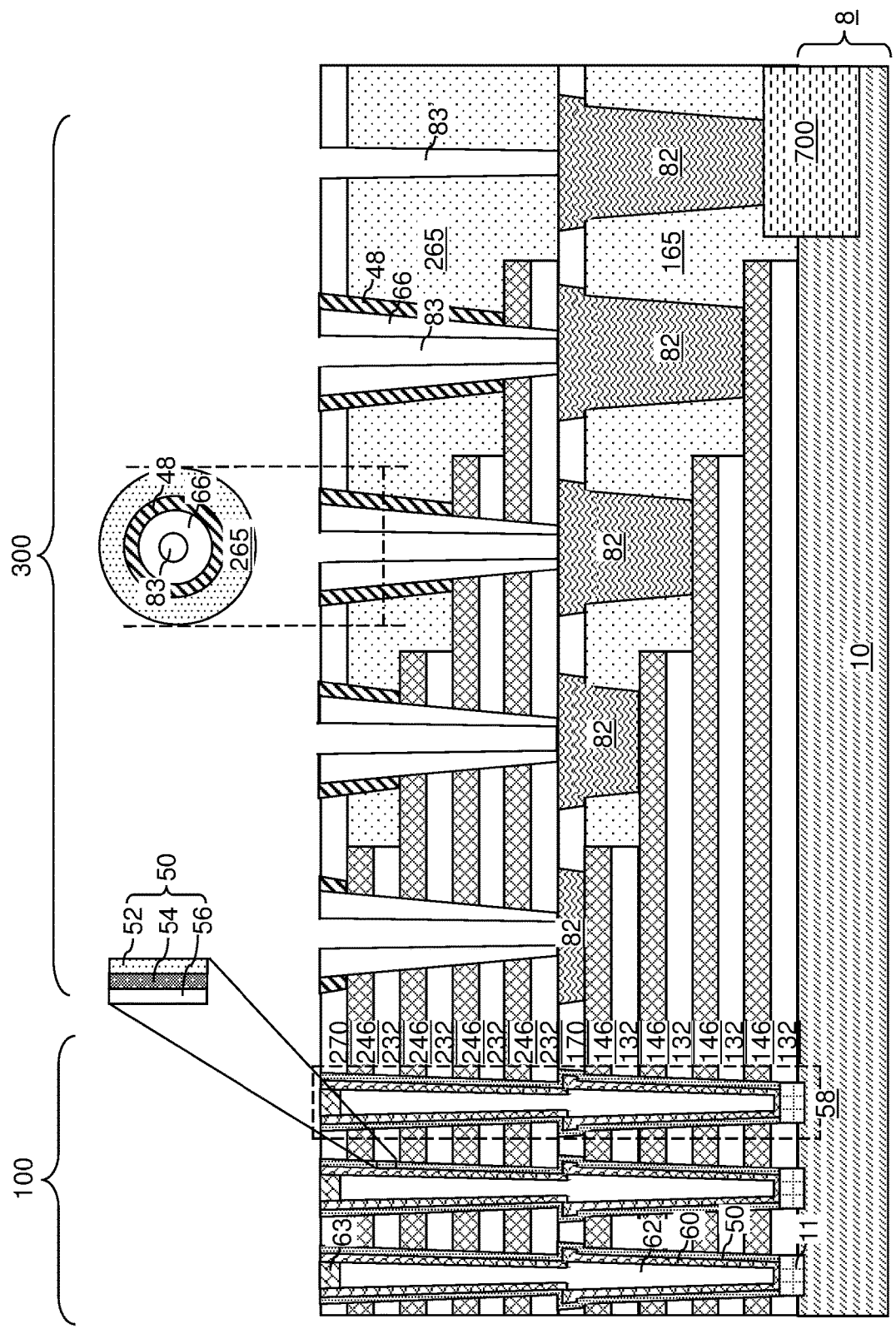
FIG. 19 is a schematic vertical cross-sectional view of the exemplary structure after formation of cylindrical cavities according to an embodiment of the present disclosure.

Referring to FIG. 19, a photoresist layer (not shown) can be applied over the second-tier structure, and can be lithographically patterned to form openings within the areas of the insulating plugs 166. An anisotropic etch process can be performed to form cylindrical cavities 83 through the insulating plugs 166. A top surface of a first-tier conductive pillar structure 82 can be physically exposed at the bottom of each cylindrical cavity 83. Each remaining portion of the insulating plug 166 can have a tubular configuration, and is herein referred to as an insulating spacer 66.

In one embodiment, the first-tier conductive pillar structures 82 may be removed by selective isotropic etching through the cavities 83. For example, if the structures 82 comprise amorphous silicon, then they may be removed using a selective silicon wet etch, such as a hot trimethyl-2 hydroxyethyl ammonium hydroxide ("hot TMY") etch. The etch reforms the first-tier contact via cavities 81. Alternatively, if the first-tier conductive pillar structures 82 comprise a heavily doped semiconductor material, such as heavily doped silicon, then the first-tier conductive pillar structures 82 may be retained in the device.

A conductive material, such as a metallic material can be deposited in the cylindrical cavities 83 (and in the first-tier contact via cavities 81 if present) by a conformal deposition process. Excess portions of the conductive material can be removed from above the horizontal plane including the top surface of the second insulating cap layer 270. Each remaining portion of the conductive material filling the cylindrical cavities 83 constitutes a conductive pillar structure, which is herein referred to as a second-tier conductive pillar structure 84. If the first-tier contact via cavities 81 are present, then the second-tier conductive pillar structure 84 also extends into the first tier through the first-tier contact via cavities 81 and forms a replacement first-tier conductive pillar structure 82 which contacts one of the first electrically conductive layers 146 exposed in the respective first-tier contact via cavities 81. Alternatively, the retained heavily doped semiconductor first-tier conductive pillar structure 82 remains in the cavity 81 and contacts one of the second-tier conductive pillar structures 84 and one of the first electrically conductive layers 146 exposed in the respective first-tier contact via cavities 81. A horizontal cross-section view of a region of a stepped contact via cavity 169 is illustrated in an inset.

The exemplary structure includes first conductive via structures (82, 84) and second conductive via structures 48 that comprise tubular conductive via structures 48. The first conductive via structures (82, 84) provide vertically-extending electrically conductive paths for the first electrically conductive layers 146. The second conductive via structures 48 provide vertically-extending electrically conductive paths for the second electrically conductive layers 246.

Each first conductive via structure (82, 84) can include a vertical stack of a first-tier conductive pillar structure 82 (i.e., a retained or a replacement structure 82) that vertically extends through the first retro-stepped dielectric material portion 165 and a second-tier conductive pillar structure 84 that is located on a top surface of the first-tier conductive pillar structure 82. The first-tier conductive pillar structure 82 contacts, and vertically extends through, the first retro-stepped dielectric material portion 165. The second-tier conductive pillar structure 84 contacts and is laterally surrounded by an insulating spacer 66.

Each contiguous set of a first conductive via structure (82, 84), an insulating spacer 66, and a second conductive via structure 48 constitutes a contact via assembly (82, 84, 66, 48). Thus, each contact via assembly (82, 84, 66, 48) comprises a first conductive via structure (82, 84) vertically extending from a top surface of one of the first electrically conductive layers 146 through a subset of layers within the second alternating stack (232, 246) and through the second retro-stepped dielectric material portion 265, an insulating spacer 66 located within an opening through the subset of layers within the second alternating stack (232, 246), and a second conductive via structure 48 laterally surrounding the insulating spacer 66 and contacting a top surface of a topmost second electrically conductive layer 246 of the subset of layers within the second alternating stack (232, 46).

In one embodiment, the second-tier conductive pillar structures 84 comprises a different conductive material than the first-tier conductive pillar structures 82. For example, the first-tier conductive pillar structures 82 can comprise a doped semiconductor material, and the second-tier conductive pillar structures 84 comprise a metallic material.

In one embodiment, the top surface of the first-tier conductive pillar structure 82 can have a greater area than a bottom surface of the second-tier conductive pillar structure 84 within each first conductive via structure (82, 84). In one embodiment, an annular bottom surface of each insulating spacer 66 can contact a top surface of a respective one of the first-tier conductive pillar structures 82.

In one embodiment, an annular top surface of each insulating spacer 66 can be located within a horizontal plane including the top surfaces of the first-tier conductive pillar structures 82. In one embodiment, an annular top surface of each second conductive via structure 48 can be located within the horizontal plane including the top surfaces of the second-tier conductive pillar structures 84.

In one embodiment, a top surface of a first-tier conductive pillar structure 82 can contact a bottom surface of a bottommost second insulating layer 232 within the second alternating stack (232, 246). In one embodiment, the entirety of a cylindrical surface of each second-tier conductive pillar structure 84 can contact an inner cylindrical sidewall of a respective one of the insulating spacers 66. In one embodiment, an outer cylindrical sidewall of an insulating spacer 66 can contact sidewalls of a subset of layers within the second alternating stack (232, 246) and an inner cylindrical sidewall of a second conductive via structure 48, which can be a tubular conductive via structure 48.

In one embodiment, the second conductive via structures 48 can have the same material composition as the second electrically conductive layers 246. In one embodiment, each second conductive via structure 48 can comprise an inner cylindrical sidewall contacting an insulating spacer 66, and an outer cylindrical sidewall contacting the second retro-stepped dielectric material portion 265. In one embodiment, the lateral distance between the inner cylindrical sidewall and the outer cylindrical sidewall may or may not be not uniform in a horizontal cross-sectional view.

Figure 21:
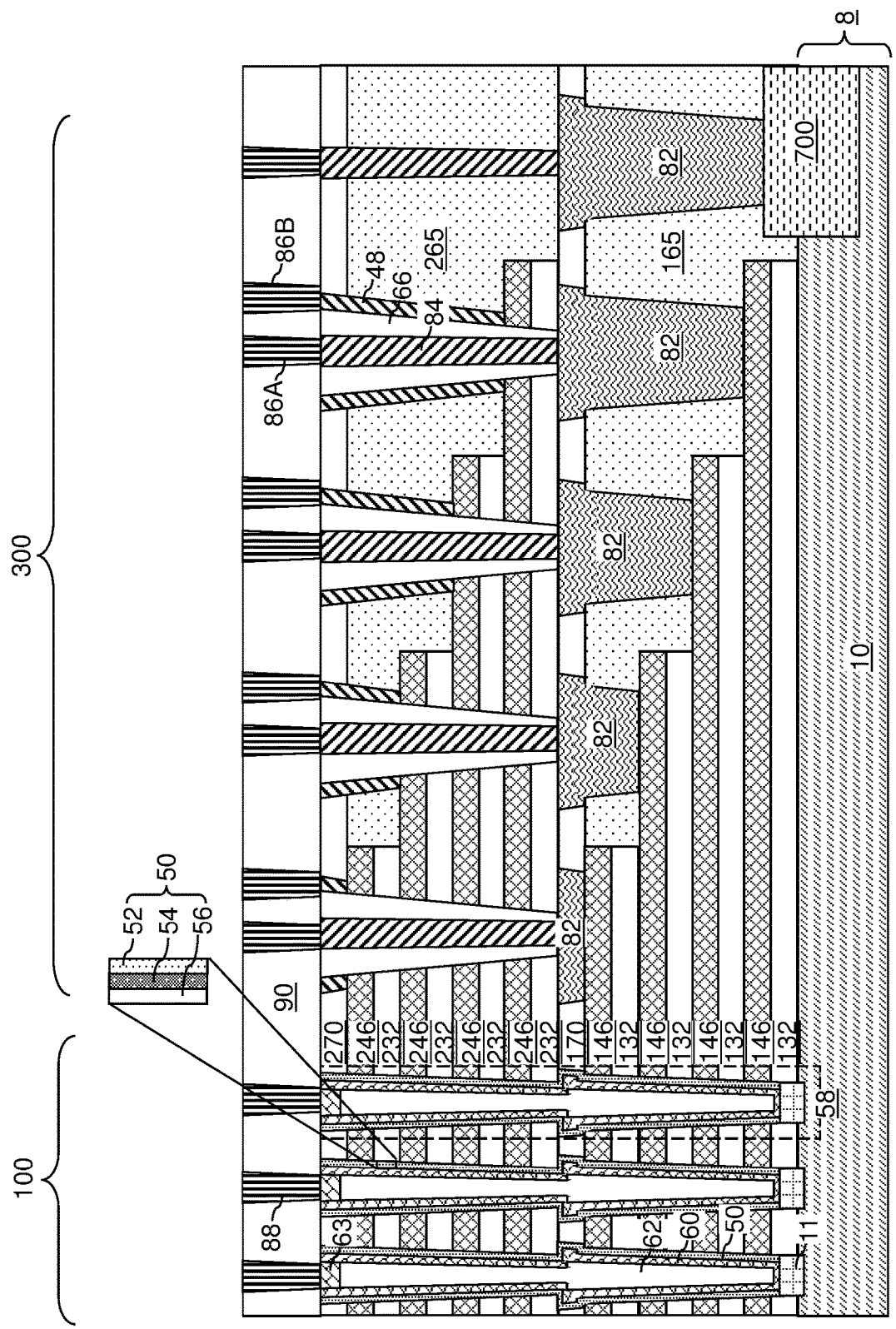
FIG. 21 is a schematic vertical cross-sectional view of the exemplary structure after formation of a connection-level dielectric layer and connection via structures according to an embodiment of the present disclosure.

Referring to FIG. 21, a connection-level dielectric layer 90 including a dielectric material such as silicon oxide can be formed over the second-tier structure. Connection via structures (86A, 86B, 88) can be formed through the connection-level dielectric layer 90. The connection via structures (86A, 86B, 88) can include drain connection via structures 88 contacting a top surface of a respective drain region 63, first connection via structures 86A contacting a top surface of a respective first conductive via structure (82, 84), and second connection via structure 86B contacting a top surface of a respective second conductive via structure 48. Bit lines (not shown) are formed over and in electrical contact with the drain connection via structures 88.

Figure 22:
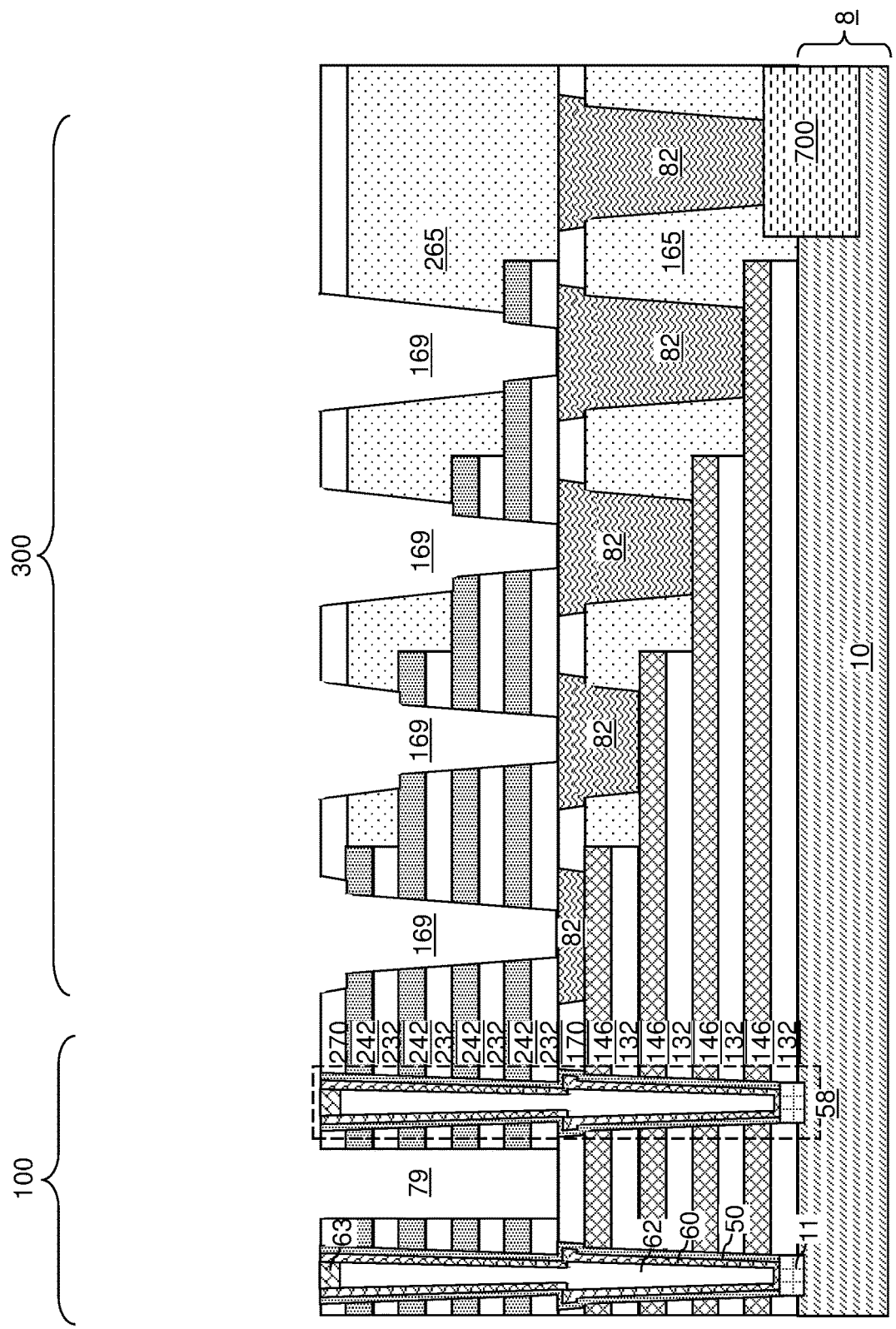
FIG. 22 is a schematic vertical cross-sectional view of an alternative embodiment of the exemplary structure after formation of voids within the stepped contact via cavities according to an embodiment of the present disclosure.

Referring to FIG. 22, an alternative embodiment of the exemplary structure can be derived from the exemplary structure of FIG. 12 by forming at least one backside trench 79 through the second alternating stack (232, 242). Sidewalls of the second insulating layers 232 and the sacrificial material layers 242 can be physically exposed around each backside trench 79. The pattern of the backside trenches 79 can be selected such that each point within the sacrificial material layers 242 is within a predetermined maximum lateral dimension from a most proximal one of the stepped contact via cavities 169 and the backside trenches 79.

Figure 23:
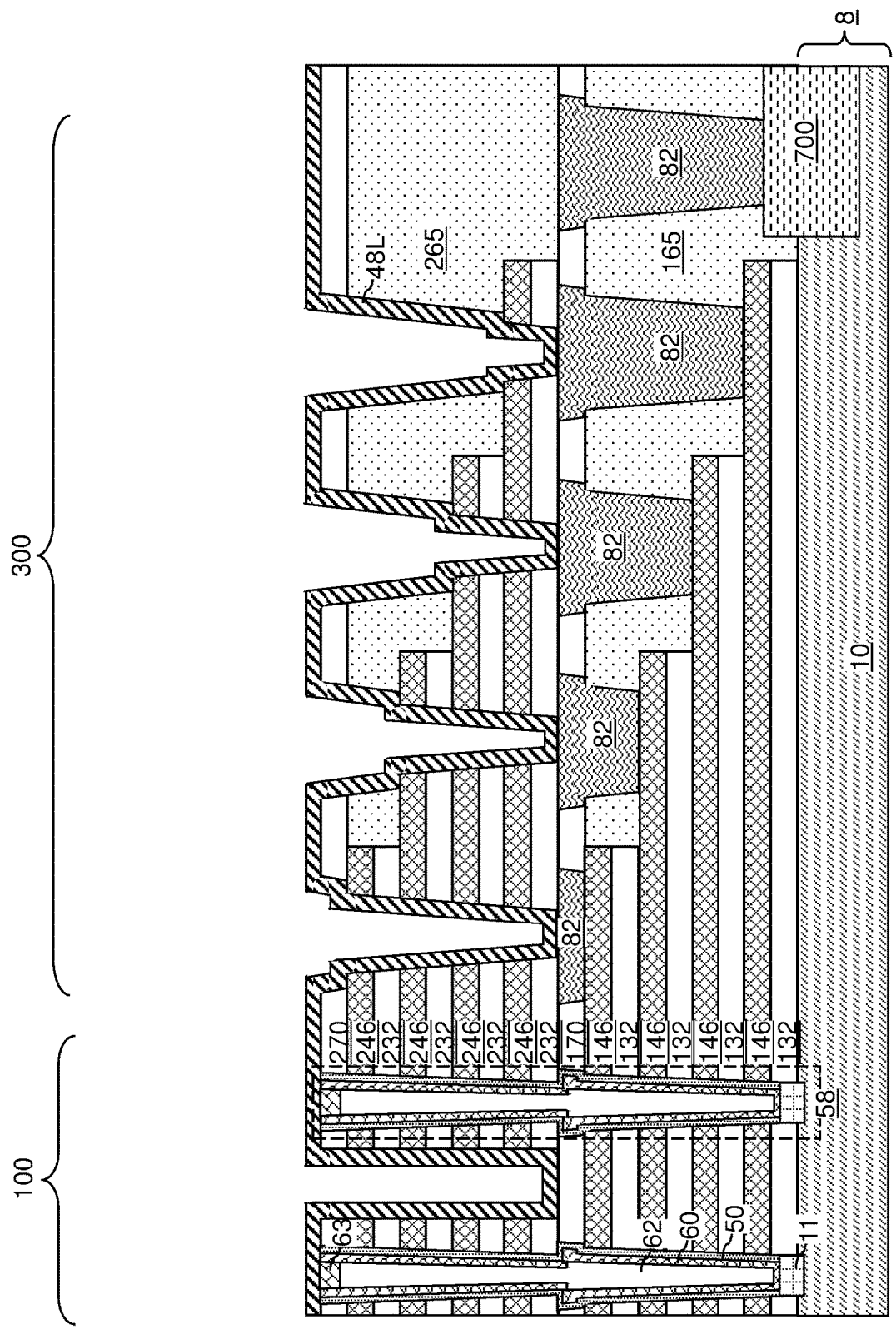
FIG. 23 is a schematic vertical cross-sectional view of the alternative embodiment of the exemplary structure after formation of a continuous metallic material layer according to an embodiment of the present disclosure.

Referring to FIG. 23, the processing steps of FIG. 13 can be performed to remove the sacrificial material layers 242 and to form backside recesses 243. The backside trenches 79 function as additional access points for supplying an isotropic etchant that etches the sacrificial material layers 242. Thus, the duration of the etch process that forms the backside recesses 243 can be reduced, and collateral etch damages to materials other than the sacrificial material layers 242 can be minimized.

Subsequently, the processing steps of FIG. 14 can be performed to form a continuous metallic material layer 48L. Portions of the continuous metallic material layer 48L that are formed in the backside recesses 243 comprise second electrically conductive layers 246.

Figure 24:
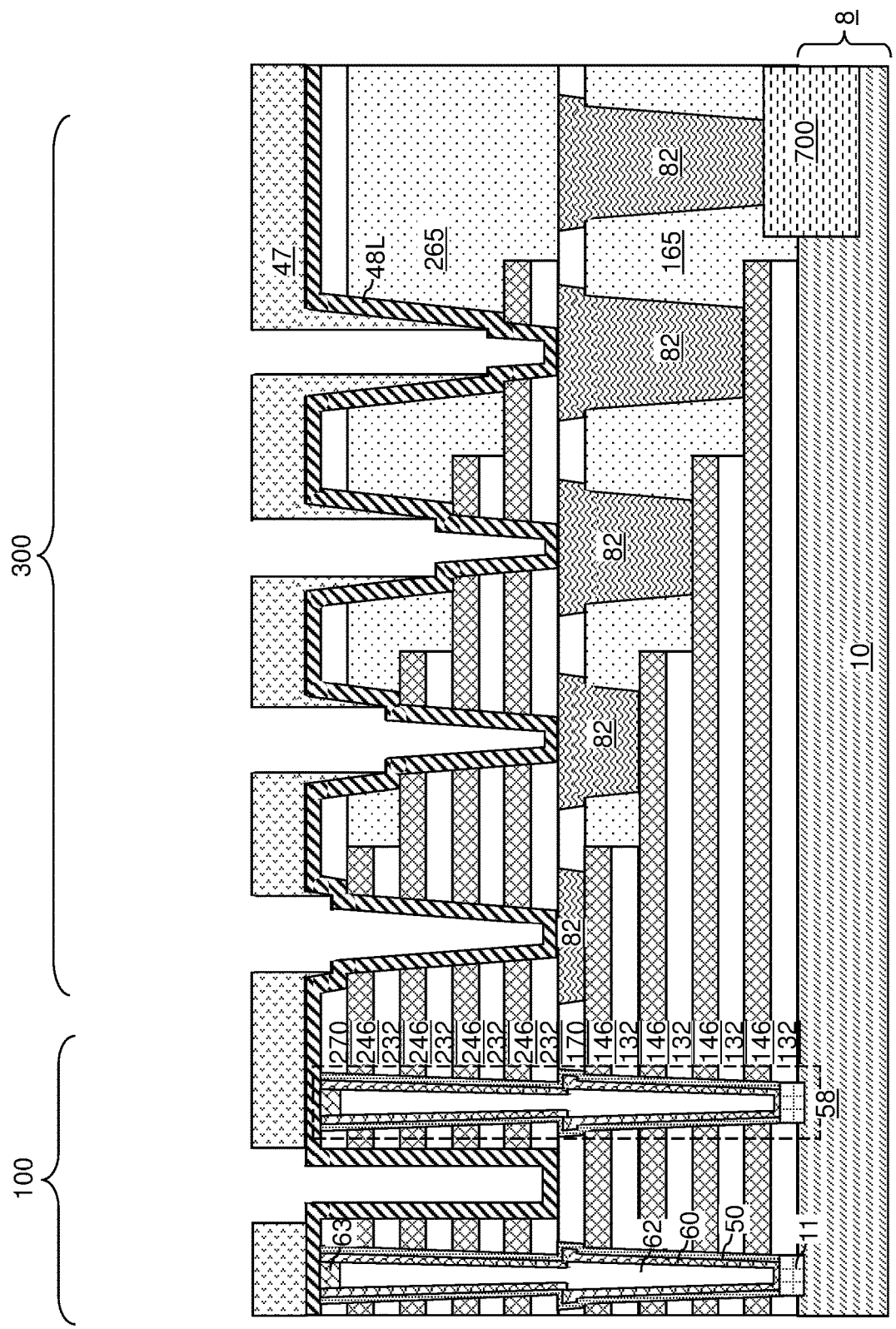
FIG. 24 is a schematic vertical cross-sectional view of the alternative embodiment of the exemplary structure after formation of a patterned photoresist layer according to an embodiment of the present disclosure.

Referring to FIG. 24, the processing steps of FIG. 15 can be performed to form the optional patterned photoresist layer 47. The patterned photoresist layer 47 can include openings over each stepped contact via cavity 169 such that a periphery of each opening in the patterned photoresist layer 47 is laterally offset inward from a periphery of an upper portion of a respective underlying stepped contact via cavity 169. In one embodiment, each opening in the patterned photoresist layer 47 can have a periphery located at, or about, a periphery of a lower portion an underlying stepped contact via cavity 169. In one embodiment, the patterned photoresist 47 can include downward-extending portions that cover portions of the continuous metallic material layer 48L located on sidewalls of the second retro-stepped dielectric material portion 265.

Figure 25:
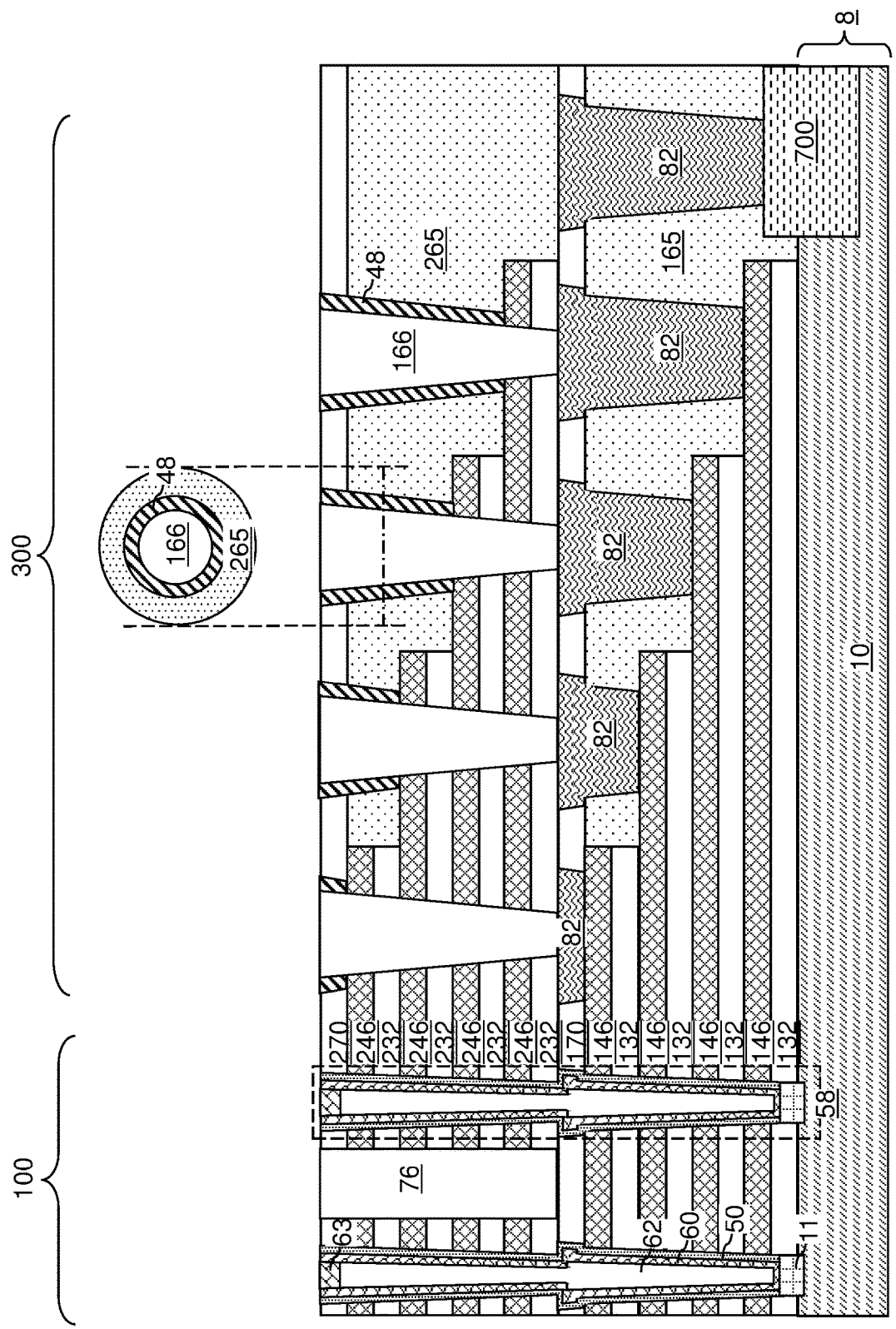
FIG. 25 is a schematic vertical cross-sectional view of the alternative configuration of the exemplary structure after formation of tubular contact via structures and insulating plugs according to an embodiment of the present disclosure.

Referring to FIG. 25, the processing steps of FIGS. 16, 17, and 18 can be performed to form the tubular contact via structures 48 and insulating plugs 166.

Figure 20:
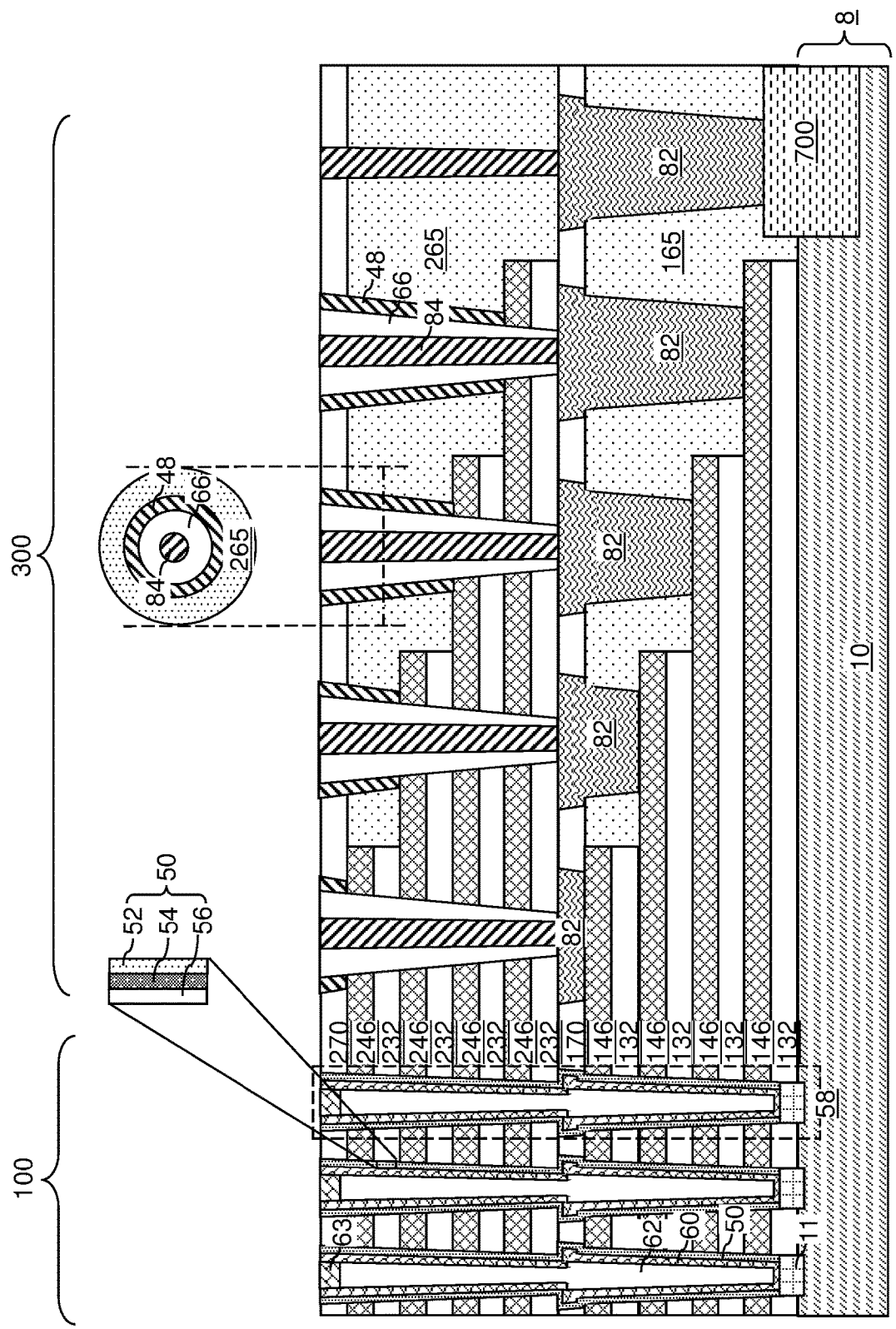
FIG. 20 is a schematic vertical cross-sectional view of the exemplary structure after formation of second-tier conductive pillar structures according to an embodiment of the present disclosure.
Figure 26:
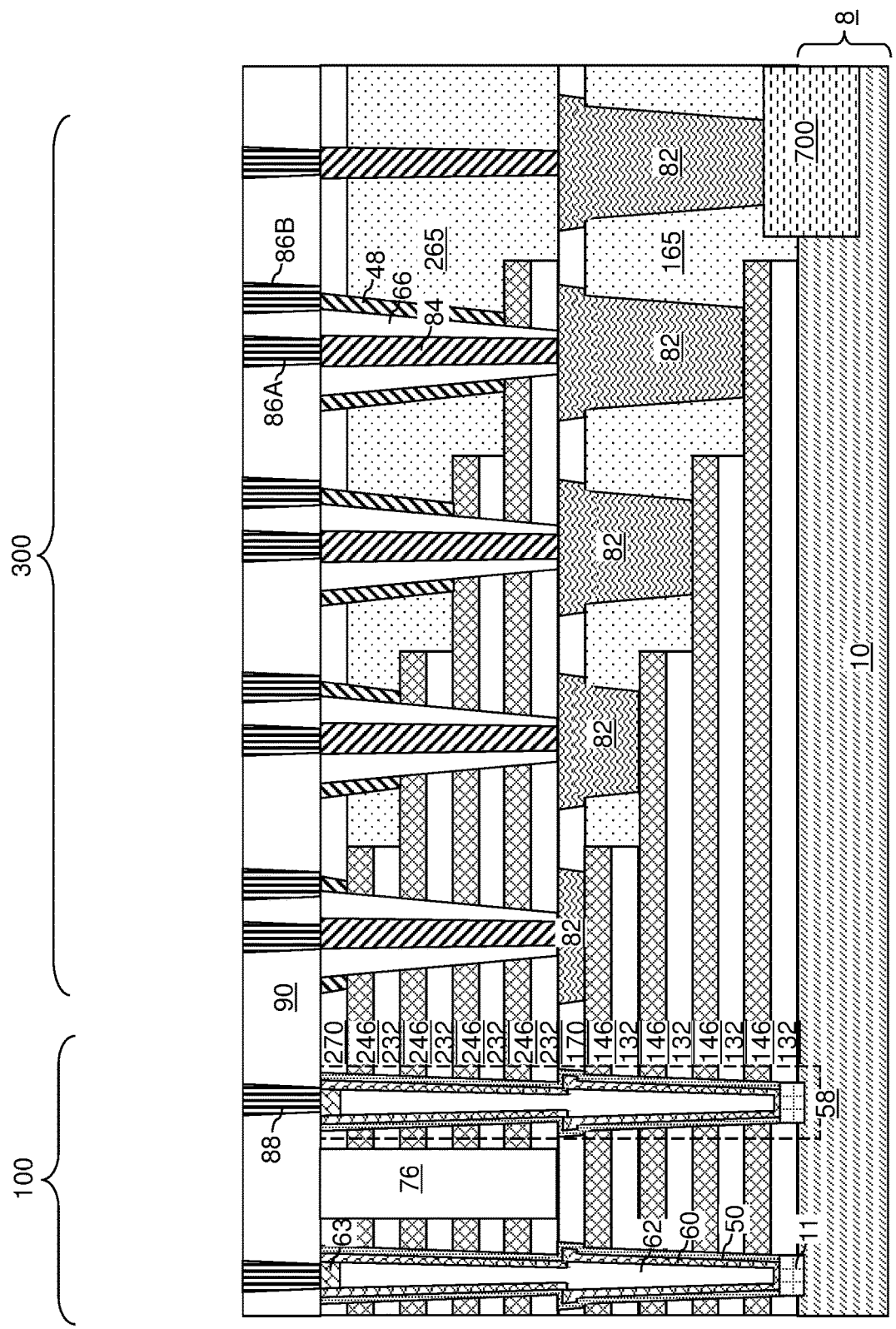
FIG. 26 is a schematic vertical cross-sectional view of the alternative configuration of the exemplary structure after formation of a connection-level dielectric layer and connection via structures according to an embodiment of the present disclosure.

Referring to FIG. 26, the processing steps of FIGS. 19, 20, and 21 can be performed to form contact via assemblies (82, 84, 66, 48), a connection-level dielectric layer 90, and connection via structures (86A, 86B, 88).

Figure 27B:
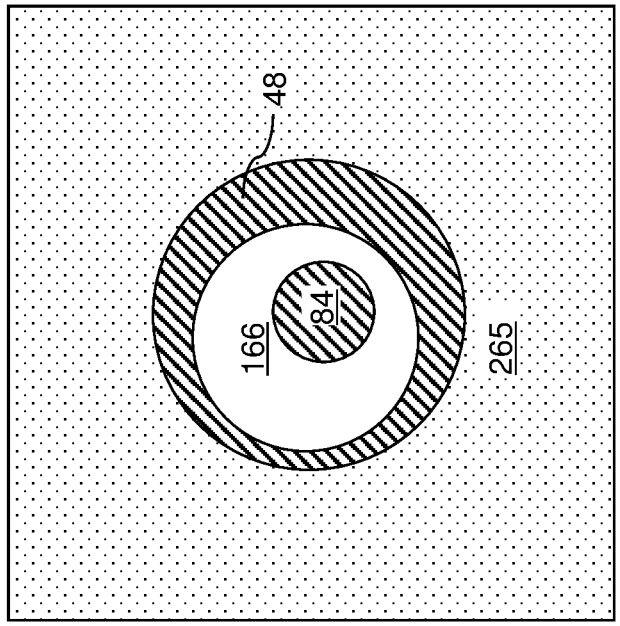
FIG. 27B is a second exemplary horizontal cross-sectional view of a contact via assembly according to an embodiment of the present disclosure.
Figure 27A:
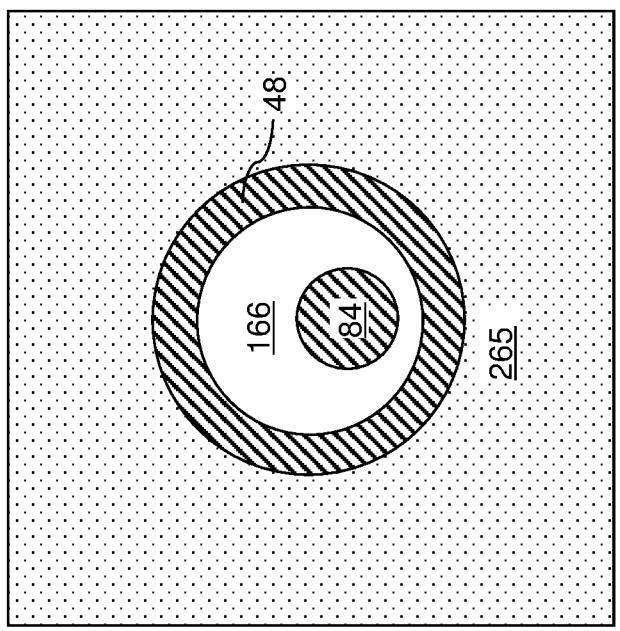
FIG. 27A is a first exemplary horizontal cross-sectional view of a contact via assembly according to an embodiment of the present disclosure.

Generally, the alignment between the second-tier conductive pillar structure 84, the insulating spacer 66, and the tubular contact via structure 48 (i.e., the second contact via structure) within each contact via assembly (82, 84, 66, 48) is determined by lithographic overlays during patterning of photoresist layers. Thus, the inner cylindrical sidewall and the outer cylindrical sidewall of each insulating spacer 66 may, or may not, be concentric relative to a vertical axis passing through the geometrical center of the second-tier conductive pillar structure and/or relative to a vertical axis passing through the geometrical center of the tubular contact via structure 48. Further, the lateral distance between the inner cylindrical sidewall and the outer cylindrical sidewall of each tubular contact via structure 48 (i.e., the second contact via structure) may, or may not, be not uniform in a horizontal cross-sectional view. FIGS. 27A and 27B illustrate exemplary horizontal cross-sectional view of a contact via assembly (82, 84, 66, 48), which do not have concentric alignment among the various sidewalls of the contact via assembly (82, 84, 66, 48).

Referring to all drawings and according to various embodiments of the present disclosure, a semiconductor structure comprising: a first alternating stack of first insulating layers 132 and first electrically conductive layers 146 having first stepped surfaces and located over a substrate 8; a first retro-stepped dielectric material portion 165 overlying the first stepped surfaces; a second alternating stack of second insulating layers 232 and second electrically conductive layers 246 having second stepped surfaces; a second retro-stepped dielectric material portion 265 overlying the second stepped surfaces; memory openings 49 vertically extending through the first alternating stack (131, 146) and the second alternating stack (232, 246); memory opening fill structures 58 located in the memory openings 49 and comprising a respective vertical semiconductor channel 60 and a respective memory film 50; and a contact via assembly (82, 84, 66, 48) comprising a first conductive via structure (82, 84) vertically extending from a top surface of one of the first electrically conductive layers 146 through a subset of layers within the second alternating stack (232, 246) and through the second retro-stepped dielectric material portion 265, an insulating spacer 66 located within an opening through the subset of layers within the second alternating stack (232, 246), and a second conductive via structure 48 laterally surrounding the insulating spacer 66 and contacting a top surface of a topmost second electrically conductive layer 246 of the subset of layers within the second alternating stack (232, 246).

The various embodiments of the present disclosure can be employed to form a three-dimensional memory device in which the second stepped surfaces of the second-tier structure have an areal overlap with the first stepped surfaces of the first-tier structure. Thus, the total device area employed to provide stepped surfaces and to provide contact via structures (82, 84, 48) can be reduced compared to prior art three-dimensional memory devices. Particularly, each contact via assembly (82, 84, 66, 48) functions as a set of nested contact via structures in which a first conductive via structure (82, 84) is laterally surrounded by a second conductive via structure 48, and provide two vertically-extending conductive paths for a first electrically conductive layer 146 and a second electrically conductive layer 246. Thus, the contact via assemblies (82, 84, 66, 48) can provide electrical contact to the electrically conductive layers (146, 246) in a multi-tier three-dimensional memory device while using a smaller total area for the contact region 300. Furthermore, the tilting of the layers of the contact via assemblies may be reduced because several layers of the contact via assemblies are formed during the same deposition steps.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:
   a first alternating stack of first insulating layers and first electrically conductive layers having first stepped surfaces and located over a substrate;
   a first retro-stepped dielectric material portion overlying the first stepped surfaces;
   a second alternating stack of second insulating layers and second electrically conductive layers having second stepped surfaces;
   a second retro-stepped dielectric material portion overlying the second stepped surfaces;
   memory openings vertically extending through the first alternating stack and the second alternating stack;
   memory opening fill structures located in the memory openings and comprising a respective vertical semiconductor channel and a respective memory film; and
   a contact via assembly comprising a first conductive via structure vertically extending from a top surface of one of the first electrically conductive layers through a subset of layers within the second alternating stack and through the second retro-stepped dielectric material portion, an insulating spacer located within an opening through the subset of layers within the second alternating stack, and a second conductive via structure laterally surrounding the insulating spacer and contacting a top surface of a topmost second electrically conductive layer of the subset of layers within the second alternating stack.

2. The semiconductor structure of claim 1, wherein the first conductive via structure comprises:
   a first-tier conductive pillar structure contacting and vertically extending through the first retro-stepped dielectric material portion; and
   a second-tier conductive pillar structure contacting and laterally surrounded by the insulating spacer.

3. The semiconductor structure of claim 2, wherein the second-tier conductive pillar structure comprises a different conductive material than the first-tier conductive pillar structure.

4. The semiconductor structure of claim 3, wherein:
   the first-tier conductive pillar structure comprises a doped semiconductor material; and
   the second-tier conductive pillar structure comprises a metallic material.

5. The semiconductor structure of claim 2, wherein a top surface of the first-tier conductive pillar structure has a greater area than a bottom surface of the second-tier conductive pillar structure.

6. The semiconductor structure of claim 2, wherein an annular bottom surface of the insulating spacer contacts a top surface of the first-tier conductive pillar structure.

7. The semiconductor structure of claim 2, wherein an annular top surface of the insulating spacer is located within a horizontal plane including a top surface of the first-tier conductive pillar structure.

8. The semiconductor structure of claim 7, wherein an annular top surface of the second conductive via structure is located within the horizontal plane including the top surface of the second-tier conductive pillar structure.

9. The semiconductor structure of claim 2, wherein a top surface of the first-tier conductive pillar structure contacts a bottom surface of a bottommost second insulating layer within the second alternating stack.

10. The semiconductor structure of claim 2, wherein an entirety of a cylindrical surface of the second-tier conductive pillar structure contacts an inner cylindrical sidewall of the insulating spacer.

11. The semiconductor structure of claim 10, wherein an outer cylindrical sidewall of the insulating spacer contacts sidewalls of the subset of layers within the second alternating stack and an inner cylindrical sidewall of the second conductive via structure.

12. The semiconductor structure of claim 1, wherein the second conductive via structure has a same material composition as the second electrically conductive layers.

13. The semiconductor structure of claim 1, wherein the second conductive via structure comprises:
- an inner cylindrical sidewall contacting the insulating spacer; and
- an outer cylindrical sidewall contacting the second retro-stepped dielectric material portion,
- wherein a lateral distance between the inner cylindrical sidewall and the outer cylindrical sidewall is not uniform in a horizontal cross-sectional view.

14. The semiconductor structure of claim 1, wherein each of the memory films comprises a tunneling dielectric layer, a blocking dielectric layer and a charge storage layer located between the tunneling dielectric layer and the blocking dielectric layer.

* * * * *